US012672435B2

(12) United States Patent　(10) Patent No.:　US 12,672,435 B2
Li et al.　(45) Date of Patent:　Jun. 30, 2026

(54) DISPLAY PANEL HAVING A GAP BETWEEN ENCAPSULATION STRUCTURES

(71) Applicant: AUO Corporation, Hsin-Chu (TW)

(72) Inventors: Wen-Jen Li, Hsin-Chu (TW); Han-Chung Lai, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 363 days.

(21) Appl. No.: 18/397,031

(22) Filed: Dec. 27, 2023

(65) Prior Publication Data

US 2025/0008776 A1　Jan. 2, 2025

(30) Foreign Application Priority Data

Jun. 29, 2023　(TW) ................................. 112124308

(51) Int. Cl.
| *H10K 59/122* | (2023.01) |
| *H10K 50/805* | (2023.01) |
| *H10K 50/844* | (2023.01) |
| *H10K 59/12* | (2023.01) |
| *H10K 59/35* | (2023.01) |
| *H10K 59/80* | (2023.01) |

(52) U.S. Cl.
CPC ......... *H10K 59/122* (2023.02); *H10K 50/805* (2023.02); *H10K 50/844* (2023.02); *H10K 59/1201* (2023.02); *H10K 59/352* (2023.02); *H10K 59/353* (2023.02); *H10K 59/805* (2023.02); *H10K 59/873* (2023.02); *H10K 59/8051* (2023.02); *H10K 59/8052* (2023.02)

(58) Field of Classification Search
None
See application file for complete search history.

(56) References Cited

U.S. PATENT DOCUMENTS

| 2020/0266248 | A1* | 8/2020 | Chen | ..................... H10K 59/878 |
| 2021/0280820 | A1* | 9/2021 | Han | ..................... H10D 86/411 |
| 2022/0149129 | A1 | 5/2022 | Park et al. | |
| 2024/0147772 | A1* | 5/2024 | Bae | ......................... H10K 59/35 |
| 2024/0196660 | A1* | 6/2024 | Kim | .................. H10K 59/1201 |
| 2024/0421179 | A1* | 12/2024 | Hung | .................. H10H 29/142 |

FOREIGN PATENT DOCUMENTS

| CN | 110729332 A | 1/2020 |
| CN | 114520257 A | 5/2022 |

* cited by examiner

*Primary Examiner* — Alonzo Chambliss
(74) *Attorney, Agent, or Firm* — Tim Tingkang Xia, Esq.; Troutman Pepper Locke LLP

(57)　ABSTRACT

A display panel includes a driving circuit layer, light emitting components and encapsulation structures. The light emitting components are disposed on the driving circuit layer, and each includes a first electrode, a light emitting pattern disposed on the first electrode, a second electrode disposed on the light emitting pattern and a pixel definition layer disposed on the driving circuit layer. The pixel definition layer has a pixel opening overlapping with the first electrode. The light emitting pattern and the second electrode cover the pixel definition layer, the first electrode located in the pixel opening and a portion of the driving circuit layer located outside the pixel opening. The encapsulation structures respectively cover the light emitting components, and each encapsulation structure includes a first encapsulation pattern. Edges of the first encapsulation pattern, the light emitting pattern and the second electrode overlapping with each other are aligned with each other.

11 Claims, 16 Drawing Sheets

DISPLAY PANEL HAVING A GAP BETWEEN ENCAPSULATION STRUCTURES

CROSS-REFERENCE TO RELATED PATENT APPLICATION

This non-provisional application claims priority to and the benefit of, pursuant to 35 U.S.C. § 119(a), patent application Ser. No. 11/212,4308 filed in Taiwan on Jun. 29, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a display panel, and particularly to a self-luminous display panel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, manufacturing of the organic light emitting diode (OLED) display panel may mainly be divided into two categories, including OLED deposition technology and OLED photolithography technology. The OLED deposition technology is forming the required light emitting pattern by vacuum deposition with a fine metal mask (FMM) in the manufacturing process. However, the expensive FMM increases the manufacturing cost of the deposition technology without satisfying the manufacturing requirement of the high resolution. The OLED photolithography technology utilizes a photolithography process to defining the required light emitting pattern on the entire deposited film of a light emitting material structure. Although the light emitting patterns of different colors may be completed by repeatedly performing deposition and photolithography on the material structures, the process is prone to oxidation of the previously formed light emitting patterns, leading to subsequent difficulties in illumination.

SUMMARY

The present disclosure provides a display panel with higher production yield and better encapsulation.

The display panel according to certain embodiments of the present disclosure includes a driving circuit layer, a plurality of light emitting components and a plurality encapsulation structures. The light emitting components are disposed on the driving circuit layer, and each includes a first electrode, a light emitting pattern, a second electrode and a pixel definition layer. The light emitting pattern is disposed on the first electrode. The second electrode is disposed on the light emitting pattern. The pixel definition layer is disposed on the driving circuit layer, and has a pixel opening overlapping with the first electrode. The light emitting pattern and the second electrode cover the pixel definition layer, the first electrode located in the pixel opening of the pixel definition layer and a portion of the driving circuit layer located outside the pixel opening of the pixel definition layer. The light emitting pattern is electrically connected to the first electrode through the pixel opening. The encapsulation structures respectively cover the light emitting components, and each encapsulation structure includes a first encapsulation pattern. Edges of the first encapsulation pattern, the light emitting pattern and the second electrode overlapping with each other are aligned with each other.

Based on the foregoing, in the display panel according to one embodiment of the present disclosure, the light emitting pattern and the second electrode of each light emitting component extend from the corresponding pixel opening of the pixel definition layer out of the pixel opening, and cover the pixel definition layer. Each encapsulation structure serve as a hard mask for defining the light emitting pattern and the second electrode, which may increase the alignment accuracy of the manufacturing process, and prevent the previously formed light emitting patterns from oxidation in the process that lead to difficulties in illumination.

These and other aspects of the present disclosure will become apparent from the following description of the embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
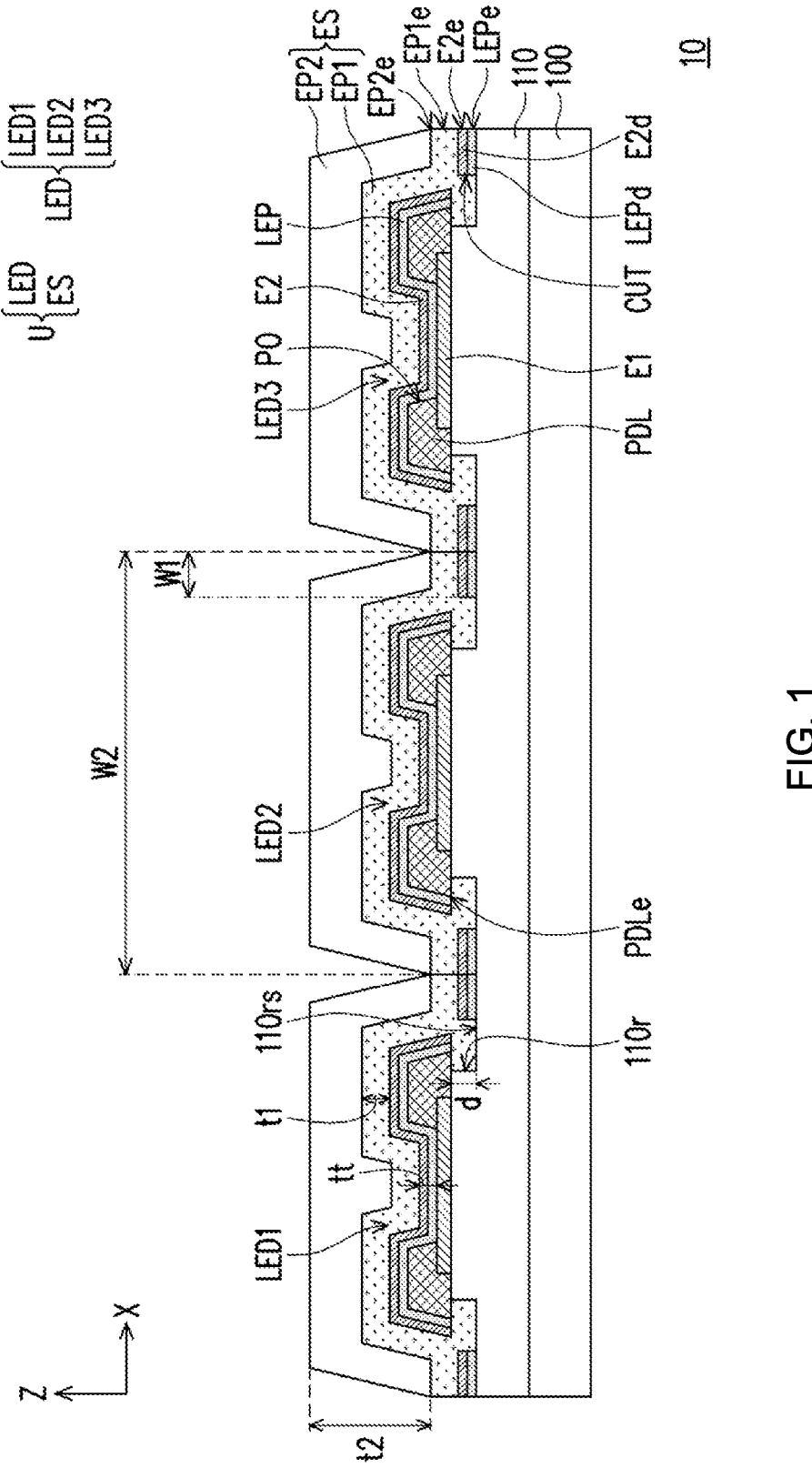
FIG. 1 is a sectional schematic view of a display panel according to a first embodiment of the present disclosure.

The terms "about", "approximately", "essentially" or "substantially" as used herein shall cover the values described, and cover an average value of an acceptable deviation range of the specific values ascertained by one of ordinary skill in the art, where the deviation range may be determined by the measurement described and specific quantities of errors related to the measurement (that is, the limitations of the measuring system). For example, the term "about" represents within one or more standard deviations of a given value of range, such as within ±30 percent, within ±20 percent, within ±15 percent, within ±10 percent or within ±5 percent. Moreover, the terms "about", "approximately", "essentially" or "substantially" as used herein may selectively refer to a more acceptable deviation range or the standard deviation based on the measuring characteristics, the cutting characteristic or other characteristics, without applying one standard deviation to all characteristics.

In the accompanying drawings, for clarity purposes, the thickness of a layer, a film, a panel, a region, etc. may be enlarged. It should be understood that when one component such as a layer, a film, a region or a substrate is referred to as being disposed "on" the other component or "connected to" the other component, the component may be directly disposed on the other component or connected to the other component, or an intermediate component may also exist between the two components. In contrast, when one component is referred to as being "directly disposed on the other component" or "directly connected to" the other component, no intermediate component exists therebetween. As used herein, a "connection" may be a physical and/or electrical connection. In addition, when two components are "electrically connected", other components may exist between the two components.

Furthermore, relative terms, such as "lower" or "bottom", "upper" or "top", and "left" and "right", may be used herein to describe the relationship between one component and the other component as illustrated in the drawings. It should be understood that the relative terms are intended to encompass different orientations of the device in addition to the orientation in the drawings. For example, if the device in one of the drawings is turned over, components described as being on the "lower" side of other components would then be oriented on "upper" sides of the other components. The exemplary term "lower" can therefore encompasses both an orientation of "lower" and "upper," depending on the particular orientation of the accompanying drawings. Similarly, if the device in one of the drawings is turned over, components described as "below" or "beneath" other components would then be oriented "above" the other components. The exemplary terms "below" or "beneath" can therefore encompass both an orientation of being above and below.

Herein, exemplary embodiments are described with reference to sectional views of schematic diagrams of ideal embodiments. Therefore, changes of shapes in the drawings that are used as results of manufacturing technology, tolerances and/or the like may be expected. Therefore, herein, the embodiments should not be explained to be limited to particular shapes of regions herein, but instead, comprise shape deviations caused by manufacturing and the like. For example, regions that are shown or described to be flat may usually have rough and/or nonlinear features. In addition, a shown acute angle may be rounded. Therefore, regions in the drawings are essentially schematic, and shapes of the regions are not intended to show precise shapes of the regions and are not intended to limit the scope of the claims.

The present disclosure will now be described hereinafter in details with reference to the accompanying drawings, in which exemplary embodiments of the disclosure are shown. Whenever possible, identical reference numerals refer to identical or like elements in the drawings and descriptions.

FIG. 1 is a sectional schematic view of a display panel according to a first embodiment of the present disclosure. FIG. 2A to FIG. 2E are sectional schematic views of a manufacturing process of the display panel of FIG. 1. For clarity, FIG. 1 illustrates only three of the display units U of the display panel 10. Referring to FIG. 1, the display panel 10 includes a substrate 100, a driving circuit layer 110, a plurality of light emitting components LED and a plurality of encapsulation structures ES. The driving circuit layer 110 is disposed on the substrate 100, and the light emitting components LED are disposed on the driving circuit layer 110. The encapsulation structures ES respectively cover the light emitting components LED. In the present embodiment, the light emitting component LED and the encapsulation structure ES overlapping with each other along the direction Z may form a display unit U of the display panel 10. The display units U may be arranged in an array on the driving circuit layer 110, and any two adjacent ones thereof are connected to each other. That is, there is no gap between any two adjacent display units U.

For example, the driving circuit layer 110 may be disposed with a plurality of pixel circuits (not illustrated), a plurality of scan lines (not illustrated), a plurality of data lines (not illustrated) and a plurality of power lines (not illustrated), and is suitable for individually controlling the light emitting components LED to emit light with identical or different intensities to achieve the image displaying purpose. If the active component and the capacitor of each pixel circuit are represented by T and C respectively, the driving circuit layer 110 may be in a 1T1C structure, a 2T1C structure, a 3T1C structure, a 3T2C structure, a 4T1C structure, a 4T2C structure, a 5T1C structure, a 5T2C structure, a 6T1C structure, a 6T2C structure, a 7T2C structure or any possible pixel circuit structure for driving the light emitting components LED, without being limited thereto.

In the present embodiment, the light emitting components LED may include a plurality of first light emitting components LED1, a plurality of second light emitting components LED2 and a plurality of third light emitting components LED3 arranged alternately along the direction X, and the light emitting color of the first light emitting components LED1, the second light emitting components LED2 and the third light emitting components LED3 may be respectively red, green and blue, without being limited thereto.

Each light emitting component LED includes a first electrode E1, a light emitting pattern LEP, a second electrode E2 and a pixel definition layer PDL. The first electrode E1 and the pixel definition layer PDL are disposed on the driving circuit layer 110. The pixel definition layer PDL partially covers the first electrode E1 and exposes a portion of the surface of the first electrode E1. More specifically, the pixel definition layer PDL has a pixel opening PO overlapping with the first electrode E1 along a normal direction of the substrate 100 (such as the direction Z). Unless otherwise particularly noted, the overlapping relationship of two members refers to the two members overlapping along the direction Z, and the overlapping direction thereof is not further reiterated.

The light emitting pattern LEP is disposed on the first electrode E1. The second electrode E2 is disposed on the light emitting pattern LEP. It should be particularly noted that the light emitting pattern LEP and the second electrode E2 cover the pixel definition layer PDL, a portion of the surface of the first electrode E1 exposed by the pixel opening PO of the pixel definition layer PDL and a portion of the driving circuit layer 110 located outside the pixel opening PO of the pixel definition layer PDL. The light emitting pattern LEP is electrically connected to the first electrode E1 through the pixel opening PO.

In the present embodiment, the driving circuit layer 110 may have a recess 110r overlapping with an outer edge PDLe of the pixel definition layer PDL, without being limited thereto. It should be noted that the light emitting pattern LEP and the second electrode E2 covering the pixel definition layer PDL and extending from the pixel opening PO out of the pixel definition layer PDL may form a breaking location CUT at the recess 110r of the driving circuit layer 110. Preferably, a ratio of a distance d between a recess bottom surface 110rs of the recess 110r defined by the driving circuit layer 110 and the pixel definition layer PDL to an overall film thickness tt of the second electrode E2 may be within a range of 1 to 3, and the distance d and the overall film thickness tt are defined along the normal direction of the substrate (such as the direction Z), thus ensuring the light emitting pattern LEP and the second electrode E2 to stably form the breaking location CUT at the recess 110r of the driving circuit layer 110.

From another perspective, the light emitting pattern LEP and the second electrode E2 of each light emitting component LED has dummy portions not overlapping with the pixel definition layer PDL and located outside the pixel opening PO, such as a dummy portion LEPd of the light emitting pattern LEP and a dummy portion E2d of the second electrode E2. The dummy portion LEPd of the light emitting pattern LEP and the dummy portion E2d of the second electrode E2 respectively extend from the edge LEPe of the light emitting pattern LEP and the edge E2e of the second electrode E2 to the breaking location CUT of the light emitting pattern LEP and the second electrode E2. More specifically, the portion of the second electrode E2 covering the pixel definition layer PDL and the dummy portion E2d are electrically independent from each other, and the portion of the light emitting pattern LEP covering the pixel definition layer PDL and the dummy portion LEPd are electrically independent from each other. Thus, when the first electrode E1 and the second electrode E2 are enabled and have a potential difference therebetween, the dummy portion LEPd of the light emitting pattern LEP does not emit light.

On the other hand, each encapsulation structure ES covering a corresponding light emitting component LED may include a first encapsulation pattern EP1 and a second encapsulation pattern EP2 sequentially stacked. That is, the first encapsulation pattern EP1 is disposed between the second encapsulation pattern EP2 and the overlapping light emitting component LED. It should be particularly noted that the first encapsulation pattern EP1 of each encapsulation structure ES covers the second electrode E2 of the corresponding light emitting component LED, and fills in the recess 110r of the driving circuit layer 110 through the breaking location CUT of the light emitting pattern LEP and the second electrode E2. In other words, the recess 110r of the driving circuit layer 110 overlapping with the outer edge PDLe of the pixel definition layer PDL and the breaking location CUT of the light emitting pattern LEP and the second electrode E2 are both filled with the first encapsulation pattern EP1 of the encapsulation structure ES.

It should be noted that, by providing the recess 110r, the first encapsulation pattern EP1 may completely cover the portion of the light emitting pattern LEP electrically connected to the first electrode E1, thus preventing the previously formed light emitting components LED from encapsulation failure in the process of subsequently forming other light emitting components that lead to the oxidation of the light emitting patterns LEP thereof and the difficulties in illumination, and significantly enhancing the production yield of the display panel 10. To balance the pixel opening rate and the encapsulation effect of the display panel, a ratio of a width W1 of the dummy portion LEDd of the light emitting pattern along the direction X to a width W2 of the first encapsulation pattern EP1 along the direction X is preferably in the range of 0.04 to 0.2.

In the present embodiment, the respective first encapsulation patterns EP1 of the encapsulation structures ES may have identical film thickness t1, and the respective second encapsulation patterns EP2 of the encapsulation structures ES may have identical film thickness t2, without being limited thereto. Herein, the film thickness is, for example, the thickness of the film layer along the direction Z.

On the other hand, in the present embodiment, the edge EP1e of the first encapsulation pattern EP1, the edge LEPe of the light emitting pattern LEP and the edge E2e of the second electrode E2 being aligned with each other may be optionally aligned with the edge EP2e of the second encapsulation pattern EP2, without being limited thereto. It should be noted that the aligning feature of the film layers is due to the manufacturing process of the light emitting components LED and the encapsulation structures ES overlapping with each other.

The manufacturing process of a display unit U of the display panel 10 will be hereinafter exemplarily described as follows.

Figure 2A:
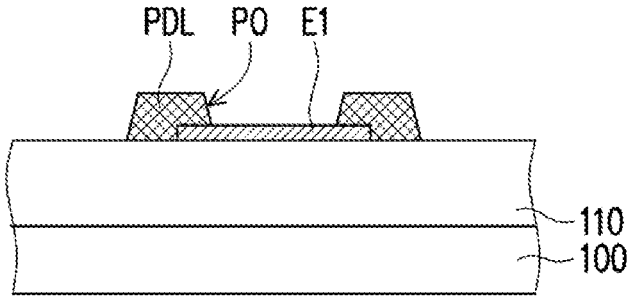
FIG. 2A to FIG. 2E are sectional schematic views of a manufacturing process of the display panel of FIG. 1.

Referring to FIG. 2A, the manufacturing method of the display panel 10 may include: forming a driving circuit layer 110 on the substrate 100, and forming the first electrode E1 and the pixel definition layer PDL on the driving circuit layer 110. The pixel definition layer PDL overlaps with a portion of the first electrode E1, and the pixel opening PO thereof exposes a portion of the surface of the first electrode E1.

Based on conductivity considerations, the first electrode E1 is generally a single-layered or multi-layered stack structure formed by at least one metal material, without being limited thereto. The first electrode E1 may be formed by an alloy, a metal nitride, a metal oxide (such as indium tin oxide, indium zinc oxide, aluminum tin oxide or aluminum zinc oxide, etc.), a metal oxynitride, or other suitable materials. The material of the pixel definition layer PDL includes an inorganic material (such as silicon oxide, silicon nitride, silicon oxynitride, other suitable materials, or a stacked layer of at least two materials thereof), an organic material (such as polyester (PET), polyolefin, polypropylene, polycarbonate, polyalkylene oxide, polystyrene, polyether, polyketone, polyol, polyaldehyde, or other suitable materials, or a combination thereof), or other suitable materials, or a combination thereof.

Figure 2B:
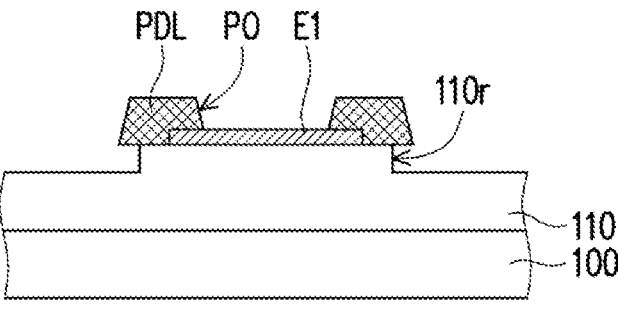

Referring to FIG. 2B, in the present embodiment, the manufacturing method of the display panel 10 may further optionally include removing the portion of the driving circuit layer 110 overlapping with the outer edge PDLe of the pixel definition layer PDL to form the recess 110r. For example, the driving circuit layer 110 may further be provided with an inorganic dulling layer covering the pixel circuit or the signal lines, and the material thereof may include silicon oxide (SiOx) or silicon nitride (SiNx), and the recess 110r of the driving circuit layer 110 may be formed by the inorganic dulling layer, without being limited thereto. The method of forming the recess 110r may include performing a wet etching process to the inorganic dulling layer of the driving circuit layer 110 using the pixel definition layer PDL and the first electrode E1 as a hard mask, without being limited thereto.

Figure 2C:
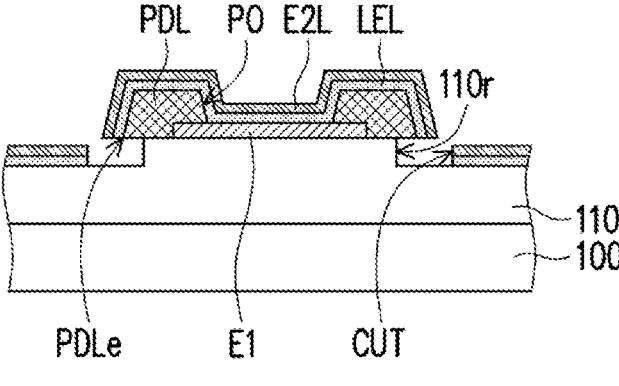

After forming the recess 110r of the driving circuit layer 110, a second electrode layer E2L and a light emitting material layer LEL are formed on the pixel definition layer PDL, as shown in FIG. 2C. The light emitting material layer LEL and the second electrode layer E2L formed entirely on the pixel definition layer PDL may rupture and form the breaking location CUT due to the recess 110r of the driving circuit layer 110 formed by shrinking inward from the outer edge PDLe of the pixel definition layer PDL.

Based on conductivity considerations, the second electrode layer E2L is generally a single-layered or multi-layered stack structure formed by at least one metal material, without being limited thereto. The second electrode layer E2L may be formed by an alloy, a metal nitride, a metal oxide (such as indium tin oxide, indium zinc oxide, aluminum tin oxide or aluminum zinc oxide, etc.), a metal oxynitride, or other suitable materials. For example, in the present embodiment, the second electrode layer E2L is formed by an alloy material of silver and magnesium.

Figure 2D:
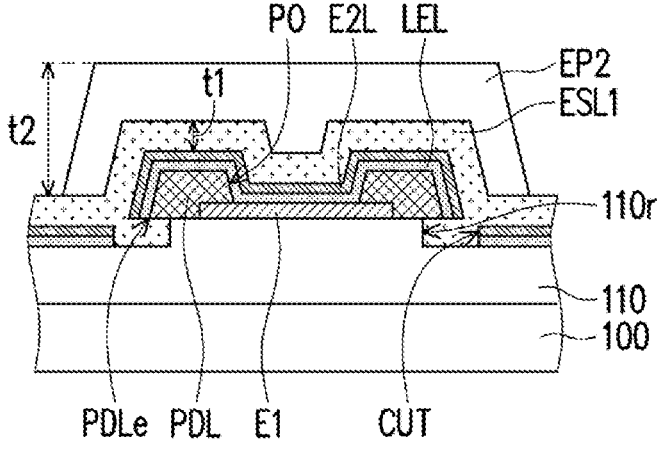

Referring to FIG. 2D, subsequently, a first encapsulation material layer ESL1 is formed on the second electrode layer E2L. It should be particularly noted that the first encapsulation material layer ESL1 covering the second electrode layer E2L may be filled into the recess 110r of the driving circuit layer 110 through the breaking location CUT of the light emitting material layer LEL and the second electrode layer E2L to entirely cover the portion of the light emitting material layer LEL and the second electrode layer E2L being electrically connected to the first electrode E1. Considering the depth of the recess 110r of the driving circuit layer 110, the film thickness t1 of the first encapsulation material layer ESL1 is preferably in a range between 5000 Å to 40000 Å.

The first encapsulation material layer ESL1 may be a multi-layered film structure of an inorganic material (including, for example, silicon nitride) and an organic material (including, for example, acrylic, epoxy, hexamethyldisi-loxane (HMDSO), or other suitable organic materials). For example, the first encapsulation material layer ESL1 may be a three-layered film structure of an inorganic material, an organic material and an inorganic material.

After forming the entirely distributed first encapsulation material layer ESL1, the second encapsulation pattern EP2 is formed thereon. For example, the steps of forming the second encapsulation pattern EP2 may include forming a second encapsulation material layer on the first encapsulation material layer ESL1 and performing a photolithography process to the second encapsulation material layer. The second encapsulation material layer is, for example, a negative photoresist layer, and the photolithography process includes, for example, performing exposure and development to the negative photoresist layer through an opening area of the metal mask to form the second encapsulation pattern EP2 overlapping with the opening area, without being limited thereto. In other embodiments, the second encapsulation pattern EP2 may be formed by performing exposure and development to a positive photoresist material, or may be formed by chemical vapor deposition (CVD) and patterning with a photolithography process.

To prevent the previously formed light emitting material layer LEL from oxidation or deterioration due to the excessively high temperature of the subsequent process, the material of the second encapsulation pattern EP2 may be preferably a material having a processing temperature being lower than 110° C. Considering the impact of the second encapsulation pattern EP2 on the transmittance of the visible light, the film thickness t2 of the second encapsulation pattern EP2 is preferably in a range of 5000 Å to 35000 Å.

Figure 2E:
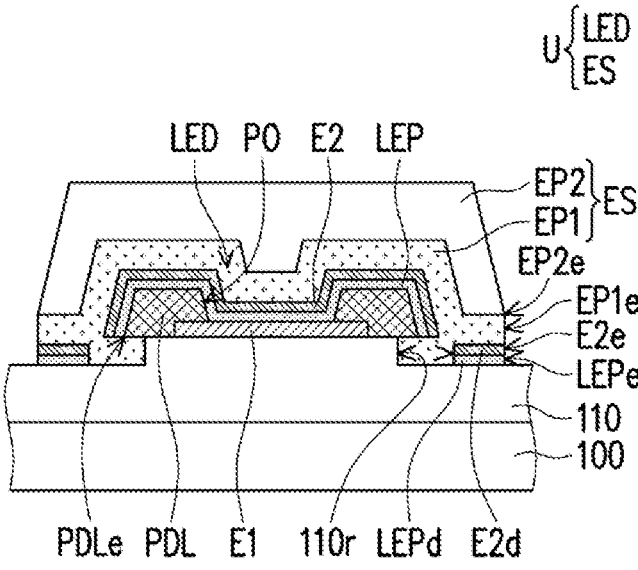

Referring to FIG. 2E, an etching process is performed on the first encapsulation material layer ESL1, the second electrode layer E2L and the light emitting material layer LEL utilizing the second encapsulation pattern EP2 as a hard mask to remove the portions of these film layers not overlapping with the second encapsulation pattern EP2 and to form the light emitting pattern LEP, the second electrode E2 and the first encapsulation pattern EP1. Thus, after the etching process is completed, the edge LEPe of the light emitting pattern LEP, the edge E2e of the second electrode E2 and the edge EP1e of the first encapsulation pattern EP1 may be respectively aligned to the edge EP2e of the second encapsulation pattern EP2. From another perspective, the second encapsulation pattern EP2 is utilized as the hard mask for defining the light emitting pattern LEP and the second electrode E2, thus effectively increasing the alignment accuracy of the encapsulation structures and the light emitting components LED, and further enhancing the encapsulation yield.

Thus, the manufacturing of a display unit U of the display panel 10 is completed. Referring to FIG. 1, in the present embodiment, the display panel 10 has three types of the display units U of different light emitting colors. Thus, the manufacturing process of FIG. 2A to FIG. 2E must be repeated for three times to manufacture the three types of the display units U of different light emitting colors in batches. For example, in the manufacturing process of the display panel 10, the display units U including the first light emitting components LED1 may be firstly formed, and then the display units U including the second light emitting components LED2 are formed, and finally the display units U including the third light emitting components LED3 are formed, without being limited thereto.

It is worth noting that the light emitting pattern LEP and the second electrode E2 have the breaking location CUT at the outer edge PDLe of the pixel definition layer PDL, such that the first encapsulation pattern EP1 may entirely cover the portion of the light emitting pattern LEP electrically connected to the first electrode E1 (that is, the electroluminescent portion) through the breaking location CUT. Thus, the previously formed display unit U (or the light emitting component) may maintain good encapsulation effect in the subsequent process of forming the display units U of different light emitting colors, which helps significantly enhance the production yield of the display panel 10.

To further enhance the entire encapsulation effect, the display panel 10 may further optionally include an encapsulation layer ESL covering the encapsulation structures. The encapsulation layer ESL may be a multi-layered film structure of an inorganic material (including, for example, silicon nitride) and an organic material (including, for example, acrylic, epoxy, hexamethyldisiloxane (HMDSO), or other suitable organic materials). For example, the encapsulation layer ESL may be a three-layered film structure of an inorganic material, an organic material and an inorganic material, without being limited thereto.

The present disclosure will be hereinafter described in detail with certain other embodiments as follows, in which identical or similar components are identified by identical or similar reference numerals, and descriptions of the identical or similar technical contents will be omitted. The omitted descriptions may be referenced to in the aforementioned embodiment, and are not hereinafter reiterated in the following embodiments.

Figure 3:
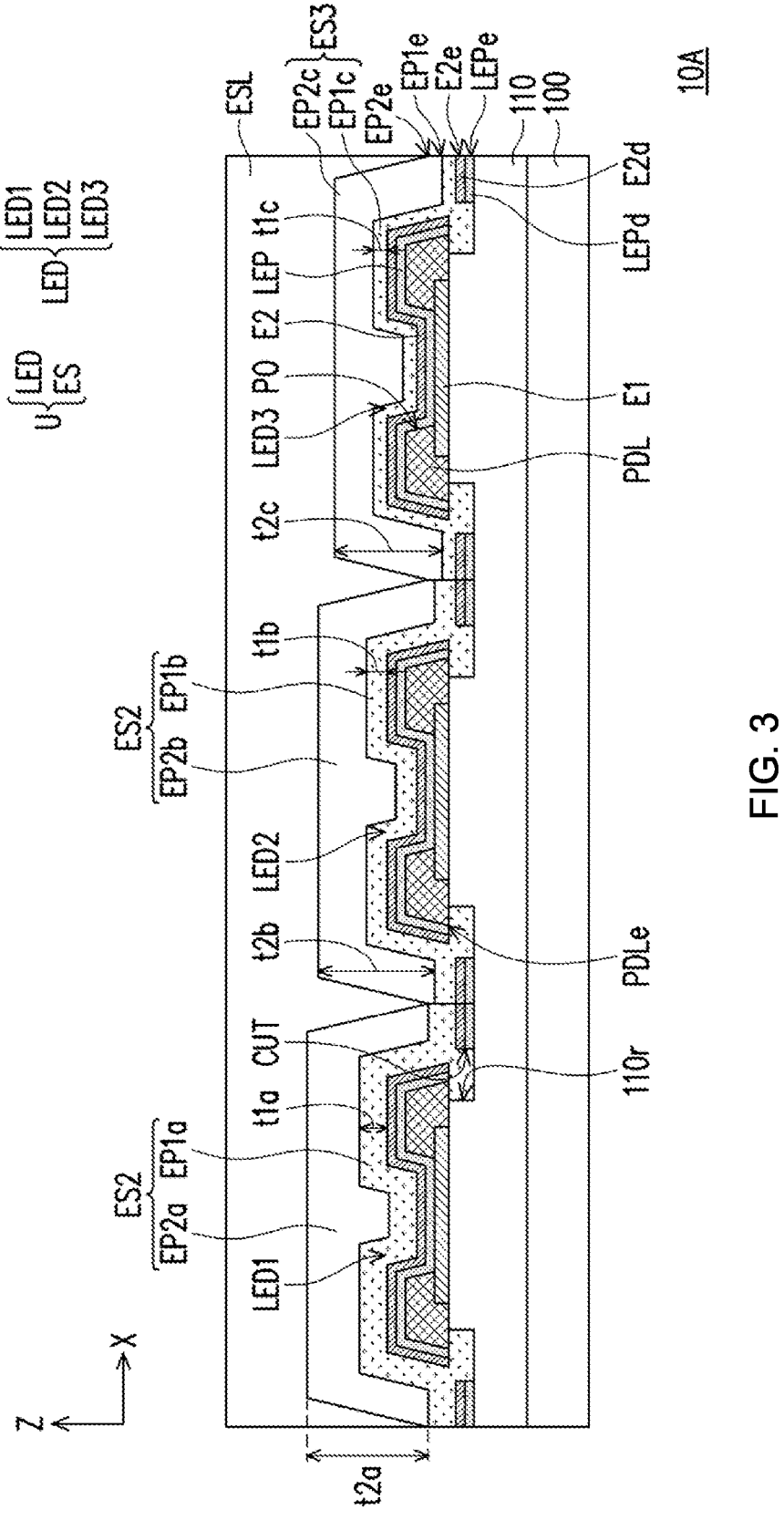
FIG. 3 is a sectional schematic view of a display panel according to a second embodiment of the present disclosure.
Figure 5:
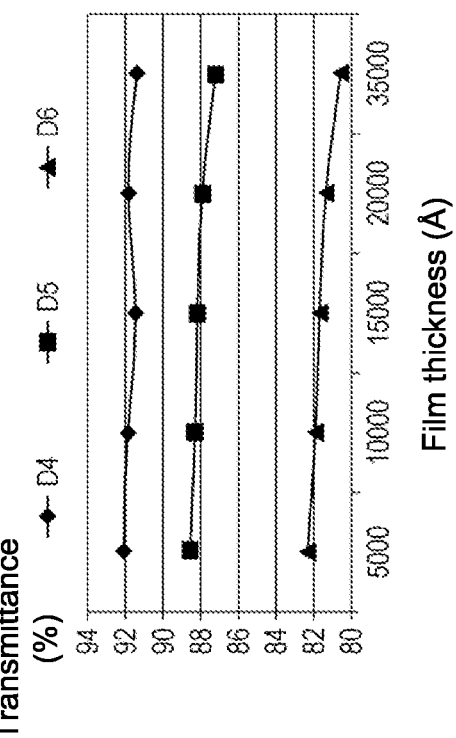
FIG. 5 is a distribution chart of the transmittance to the film thickness of the second encapsulation pattern of FIG. 3.
Figure 4:
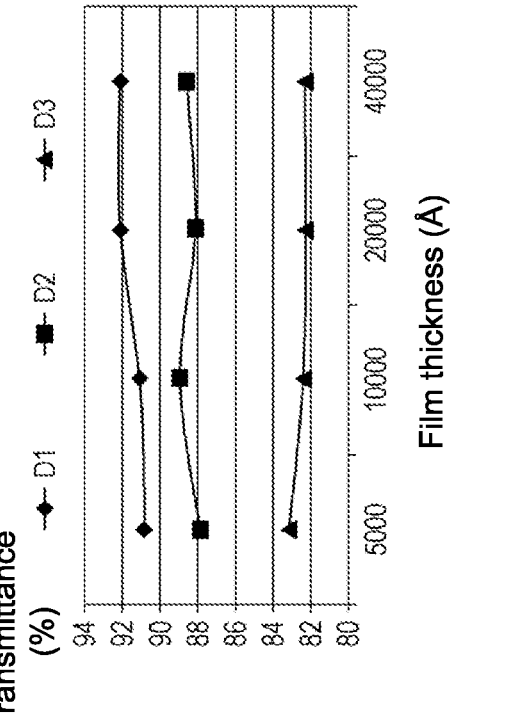
FIG. 4 is a distribution chart of the transmittance to the film thickness of the first encapsulation pattern of FIG. 3.

FIG. 3 is a sectional schematic view of a display panel according to a second embodiment of the present disclosure. FIG. 4 is a distribution chart of the transmittance to the film thickness of the first encapsulation pattern of FIG. 3. FIG. 5 is a distribution chart of the transmittance to the film thickness of the second encapsulation pattern of FIG. 3. For clarity, FIG. 3 illustrates only three of the display units U of the display panel 10A.

Referring to FIG. 3, in the present embodiment, the display panel 10A includes a first encapsulation structure ES1 covering the first light emitting component LED1, a second encapsulation structure ES2 covering the second light emitting component LED2 and a third encapsulation structure ES3 covering the third light emitting component LED3. Different from the encapsulation structures ES of FIG. 1, which respectively have the first encapsulation patterns EP1 with the identical film thickness t1 and the second encapsulation patterns EP2 with the identical film thickness t2, in the present embodiment, in the display panel 10A, the film thickness t1$a$ of the first encapsulation pattern EP1$a$ of the first encapsulation structure ES1, the film thickness t1$b$ of the first encapsulation pattern EP1$b$ of the second encapsulation structure ES2 and the film thickness t1$c$ of the first encapsulation pattern EP1$c$ of the third encapsulation structure ES3 are different, and the film thickness t2$a$ of the second encapsulation pattern EP2$a$ of the first encapsulation structure ES1, the film thickness t2$b$ of the second encapsulation pattern EP2$b$ of the second encapsulation structure ES2 and the film thickness t2$c$ of the second encapsulation pattern EP2$c$ of the third encapsulation structure ES3 are different.

Referring to FIG. 1 and FIG. 4, the distribution D1 shows the transmittance of the first encapsulation patterns EP1$a$ with different film thicknesses in the light emitting wavelength section of the first light emitting component LED1 (such as the red light wavelength section with the wavelength range of 600 nm to 650 nm), the distribution D2 shows the transmittance of the first encapsulation patterns EP1$b$ with different film thicknesses in the light emitting wavelength section of the second light emitting component LED2 (such as the green light wavelength section with the wavelength range of 500 nm to 550 nm), and the distribution D3 shows the transmittance of the first encapsulation patterns EP1$c$ with different film thicknesses in the light emitting wavelength section of the third light emitting component LED3 (such as the blue light wavelength section with the wavelength range of 400 nm to 450 nm). It is understood from the drawings that, when the film thickness of the first encapsulation pattern EP1$a$ of the first encapsulation structure ES1 is 20000 Å, the transmittance thereof to the red light is the greatest. When the film thickness of the first light is the greatest. When the film thickness of the first encapsulation pattern EP1$b$ of the second encapsulation structure ES2 is 10000 Å, the transmittance thereof to the green light is the greatest. When the film thickness of the first encapsulation pattern EP1$c$ of the third encapsulation structure ES3 is 5000 Å, the transmittance thereof to the blue light is the greatest.

In other words, when the first light emitting component LED1, the second light emitting component LED2 and the third light emitting component LED3 are suitable for emitting red light, green light and blue light (that is, the light emitting colors of the three light emitting components are different from each other), the film thickness t1$c$ of the first encapsulation pattern EP1$c$ of the third encapsulation structure ES3 is less than the film thickness t1$b$ of the first encapsulation pattern EP1$b$ of the second encapsulation structure ES2, and the film thickness t1$b$ of the first encapsulation pattern EP1$b$ of the second encapsulation structure ES2 is less than the film thickness t1$a$ of the first encapsulation pattern EP1$a$ of the first encapsulation structure ES1 (as shown in FIG. 3), thus effectively enhancing the maximum light emitting amount of the display panel 10A on the premise of ensuring encapsulation effect of the first encapsulation patterns.

On the other hand, referring to FIG. 1 and FIG. 5, the distribution D4 shows the transmittance of the second encapsulation patterns EP2$a$ with different film thicknesses in the light emitting wavelength section of the first light emitting component LED1 (such as the red light wavelength section with the wavelength range of 600 nm to 650 nm), the distribution D5 shows the transmittance of the second encapsulation patterns EP2$b$ with different film thicknesses in the light emitting wavelength section of the second light emitting component LED2 (such as the green light wavelength section with the wavelength range of 500 nm to 550 nm), and the distribution D6 shows the transmittance of the second encapsulation patterns EP2$c$ with different film thicknesses in the light emitting wavelength section of the third light emitting component LED3 (such as the blue light wavelength section with the wavelength range of 400 nm to 450 nm). It is understood from the drawings that, although the transmittances of the second encapsulation patterns to each light emitting wavelength section substantially reduce with the increase of the film thicknesses thereof, regardless of the film thicknesses, the transmittance of the second encapsulation pattern EP2$a$ to the red light is higher than the transmittance of the second encapsulation pattern EP2$b$ to the green light, and the transmittance of the second encapsulation pattern EP2$b$ to the green light is significantly higher than the transmittance of the second encapsulation pattern EP2$c$ to the blue light.

In other words, when the first light emitting component LED1, the second light emitting component LED2 and the third light emitting component LED3 are suitable for emitting red light, green light and blue light (that is, the light emitting colors of the three light emitting components are different from each other), the film thickness t2$a$ of the second encapsulation pattern EP2$a$ of the first encapsulation structure ES1 is greater than the film thickness t2$b$ of the second encapsulation pattern EP2$b$ of the second encapsulation structure ES2, and the film thickness t2$b$ of the second encapsulation pattern EP2$b$ of the second encapsulation structure ES2 is greater than the film thickness t2$c$ of the second encapsulation pattern EP2$c$ of the third encapsulation structure ES3 (as shown in FIG. 3), thus effectively enhancing the maximum light emitting amount of the display panel 10A on the premise of ensuring encapsulation effect of the second encapsulation patterns.

From another perspective, to reduce the transmittance difference of the encapsulation structures to light of different colors, in addition to the different configurations of the film thicknesses, the materials of the encapsulation structures overlapping with the light emitting components LED of different light emitting colors may also be different. For example, the materials of the first encapsulation pattern EP1a of the first encapsulation structure ES1, the second encapsulation pattern EP1b of the second encapsulation structure ES2 and the first encapsulation pattern EP1c of the third encapsulation structure ES3 may be different from each other, and the materials of the second encapsulation pattern EP2a of the first encapsulation structure ES1, the second encapsulation pattern EP2b of the second encapsulation structure ES2 and the second encapsulation pattern EP2c of the third encapsulation structure ES3 may also be different from each other.

Figure 6:
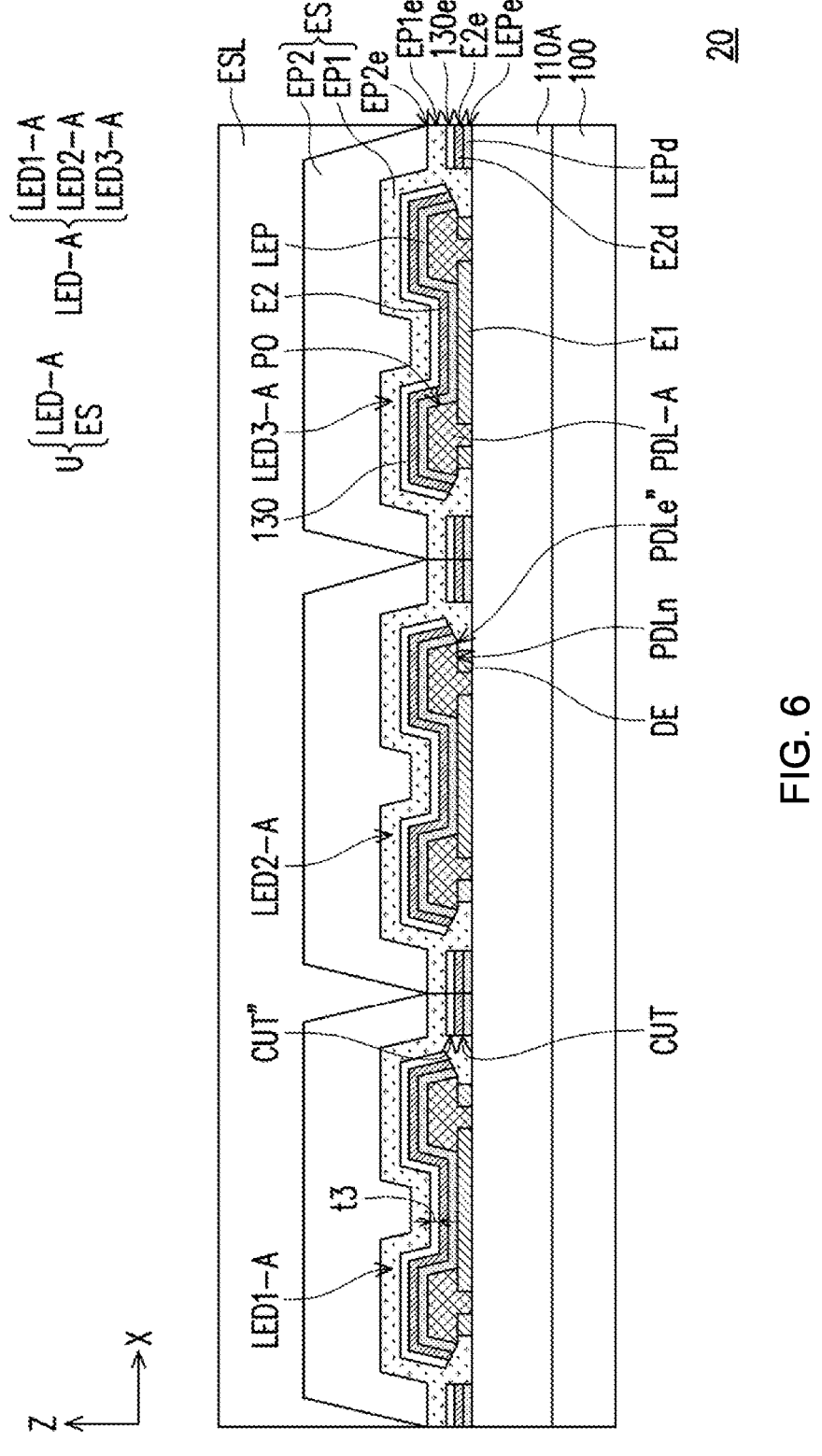
FIG. 6 is a sectional schematic view of a display panel according to a third embodiment of the present disclosure.

FIG. 6 is a sectional schematic view of a display panel according to a third embodiment of the present disclosure. For clarity, FIG. 6 illustrates only three of the display units U of the display panel 20. Referring to FIG. 6, the display panel 20 in the present embodiment is different from the display panel 10 of FIG. 1 in that the composition of the light emitting component is different, and the forming method of the breaking location of the light emitting pattern and the second electrode is different. Specifically, to avoid the second electrode of the light emitting component LED-A from being damaged in the subsequent manufacturing process, the light emitting component LED-A of the display panel 20 may further include a protection layer 130, sandwiched and disposed between the second electrode E2 and the corresponding encapsulation structure ES. The protection layer 130 may be formed optionally by a transparent conductive material (such as indium tin oxide, indium zinc oxide, aluminum tin oxide, aluminum zinc oxide, or other suitable metal oxide, or a stacked layer of at least two thereof). In the present embodiment, the film thickness t3 of the respective protection layers 130 of the first light emitting component LED1-A, the second light emitting component LED2-A and the third light emitting component LED3-A may be optionally identical, without being limited thereto. Preferably, the film thickness t3 of the protection layer 130 may be less than or equal to 1500 Å.

On the other hand, the driving circuit layer 110A in the present embodiment does not have the recess 110r formed in the driving circuit layer 110A in the embodiment of FIG. 1. Instead, the pixel definition layer in the present embodiment may have an outer edge PDLe" away from the pixel opening PO and a notch PDLn recessing inward from the outer edge PDLe". By providing the notch PDLn, the light emitting pattern LEP and the second electrode E2 subsequently formed may rupture and form the breaking location CUT at the notch PDLn of the pixel definition layer PDL-A. Similarly, the protection layer 130 covering the second electrode E2 may also rupture and form the breaking location CUT" at the notch PDLn of the pixel definition layer PDL-A.

The first encapsulation pattern EP1 of the encapsulation structure ES of the light emitting component LED-A may be filled into the notch PDLn of the pixel definition layer PDL-A through the breaking location CUT of the light emitting pattern LEP and the second electrode E2 and the breaking location CUT" of the protection layer 130. That is, the notch PDLn of the pixel definition layer PDL-A, the breaking location CUT of the light emitting pattern LEP and the second electrode E2 and the breaking location CUT" of the protection layer 130 are all filled with the first encapsulation pattern EP1 of the encapsulation structure ES.

In the present embodiment, the manufacturing method for defining the protection layer 130 and the manufacturing method for defining the light emitting pattern LEP and the second electrode E2 may be optionally identical. For example, the protection layer 130 may be simultaneously formed in the etching process forming the light emitting pattern LEP and the second electrode E2 (as shown in FIG. 2D and FIG. 2E). In other words, the edge 130e of the protection layer 130 may be aligned with the edge EP1e of the first encapsulation pattern EP1, the edge LEPe of the light emitting pattern LEP and the edge E2e of the second electrode E2. It should be particularly noted that, in the present embodiment, a dummy electrode DE may be disposed in the notch PDLn of the pixel definition layer PDL-A, and the dummy electrode DE and the first electrode E1 may be the same film layer, without being limited thereto.

Figure 7:
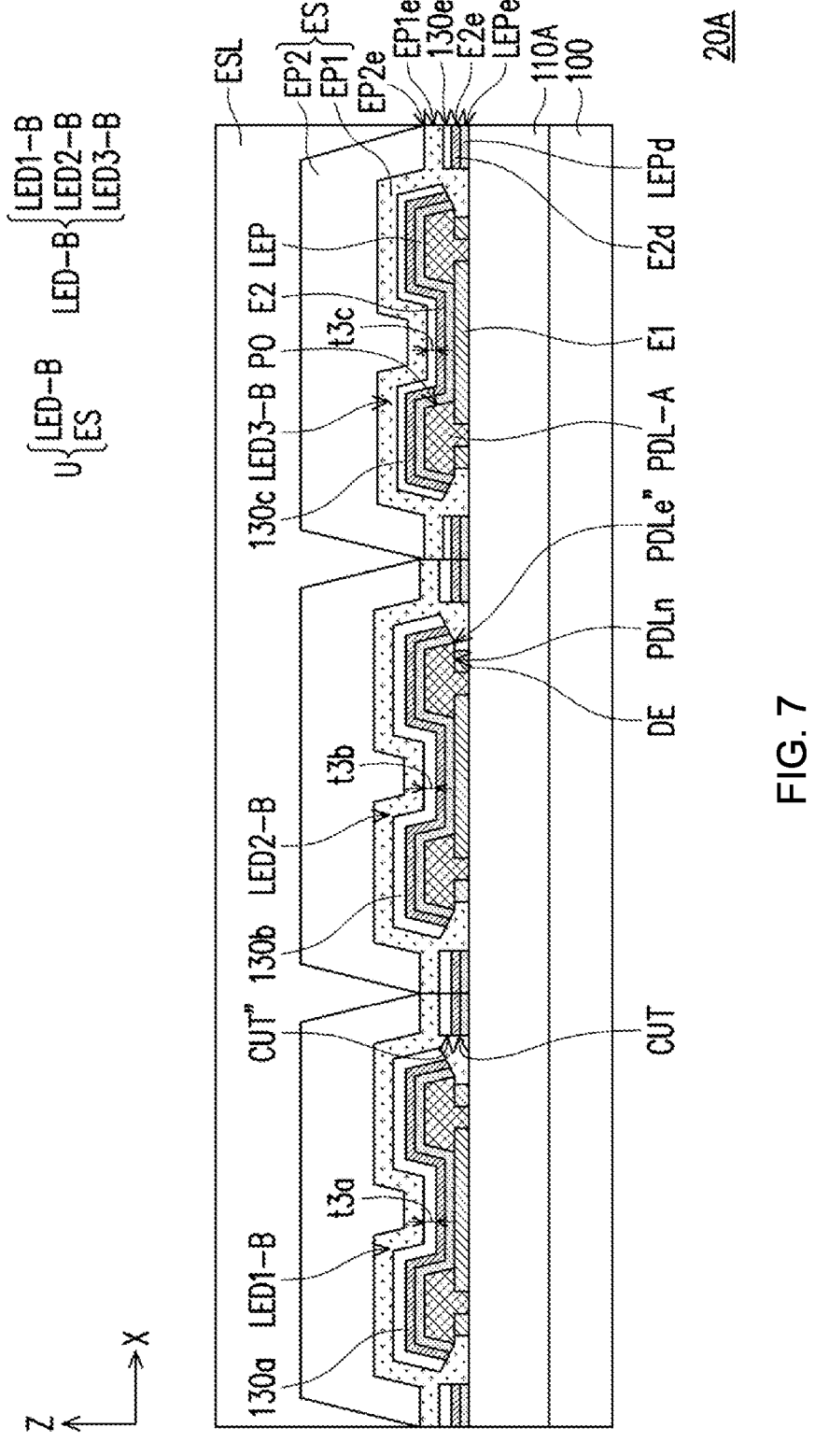
FIG. 7 is a sectional schematic view of a display panel according to a fourth embodiment of the present disclosure.
Figure 8:
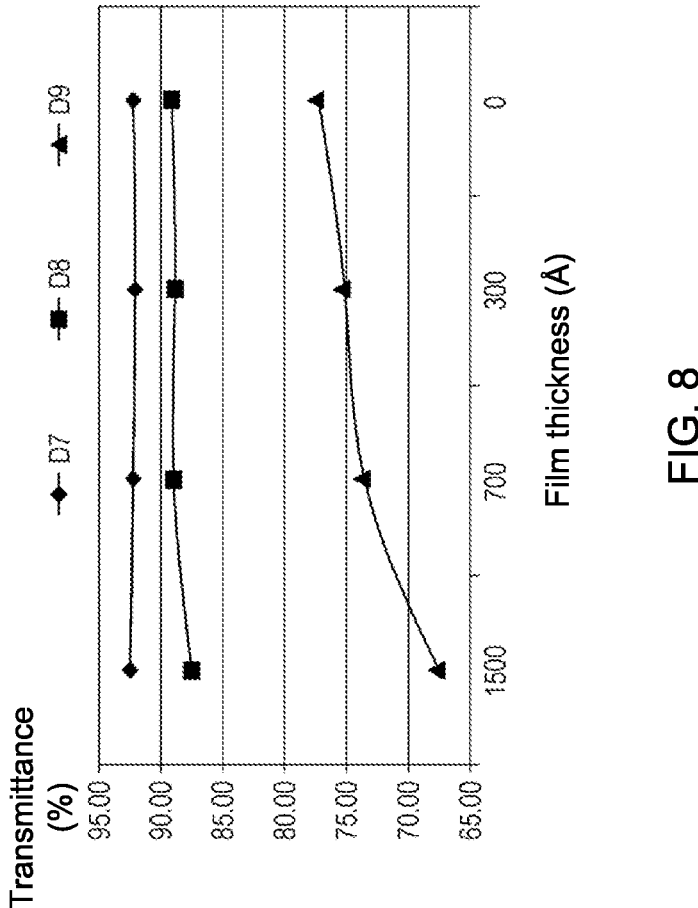
FIG. 8 is a distribution chart of transmittance to the film thickness of the protection layer of FIG. 7.

FIG. 7 is a sectional schematic view of a display panel according to a fourth embodiment of the present disclosure. FIG. 8 is a distribution chart of transmittance to the film thickness of the protection layer of FIG. 7. For clarity, FIG. 7 illustrates only three of the display units U of the display panel 20A. Referring to FIG. 7, different from the display panel 20 in the embodiment of FIG. 6, the film thickness of the respective protection layers of the light emitting components LED-B (such as the first light emitting component LED1-B, the second light emitting component LED2-B and the third light emitting component LED3-B) of the display panel 20A in the present embodiment are different from each other.

Referring to FIG. 7 and FIG. 8, the distribution D7 shows the transmittance of the protection layers 130a with different film thicknesses in the light emitting wavelength section of the first light emitting component LED1-B (such as the red light wavelength section with the wavelength range of 600 nm to 650 nm), the distribution D8 shows the transmittance of the protection layers 130b with different film thicknesses in the light emitting wavelength section of the second light emitting component LED2-B (such as the green light wavelength section with the wavelength range of 500 nm to 550 nm), and the distribution D9 shows the transmittance of the protection layers 130c with different film thicknesses in the light emitting wavelength section of the third light emitting component LED3-B (such as the blue light wavelength section with the wavelength range of 400 nm to 450 nm). It is understood from the drawings that the transmittances of the protection layer 130a and the protection layer 130b respectively to the red light wavelength section and the green light wavelength section do not significantly change with the increase of the film thicknesses thereof, but the transmittance of the protection layer 130c to the blue light wavelength section significantly reduces with the increase of the film thickness of the protection layers 130c. In addition, regardless of the film thicknesses, the transmittance of the protection layer 130a to the red light is higher than the transmittance of the protection layer 130b to the green light, and the transmittance of the protection layer 130b to the green light is significantly higher than the transmittance of the protection layer 130c to the blue light.

In other words, when the first light emitting component LED1-B, the second light emitting component LED2-B and the third light emitting component LED3-B are suitable for emitting red light, green light and blue light, the film thickness t3a of the protection layer 130a of the first light emitting component LED1-B is greater than the film thickness t3b of the protection layer 130b of the second light emitting component LED2-B, and the film thickness t3b of the protection layer 130*b* of the second light emitting component LED2-B is greater than the film thickness t3*c* of the protection layer 130*c* of the third light emitting component LED3-B, thus effectively enhancing the maximum light emitting amount of the display panel 20A on the premise of ensuring encapsulation effect of the second encapsulation patterns. Preferably, the film thickness t3*a* of the protection layer 130*a*, the film thickness t3*b* of the protection layer 130*b* and the film thickness t3*c* of the protection layer 130*c* may be less than or equal to 1500 Å.

Since the components not mentioned in the present embodiment are similar to those in the display panel 20 of FIG. 6, the detailed descriptions thereof may be referenced to the corresponding paragraphs in the aforementioned embodiment, and are not reiterated herein.

Figure 9:
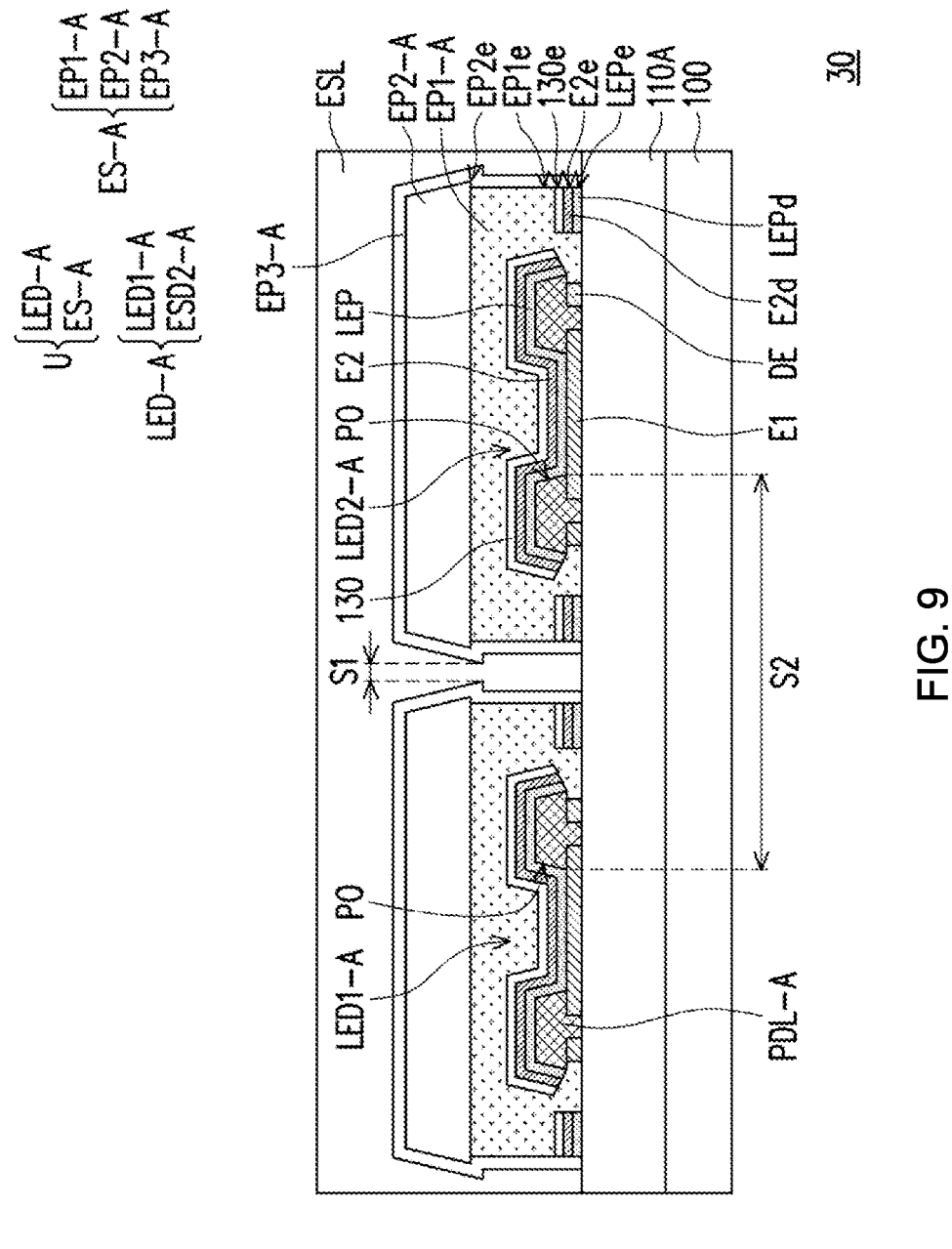
FIG. 9 is a sectional schematic view of a display panel according to a fifth embodiment of the present disclosure.

FIG. 9 is a sectional schematic view of a display panel according to a fifth embodiment of the present disclosure. For clarity, FIG. 9 illustrates only two of the display units U of the display panel 30. Referring to FIG. 9, the display panel 30 in the present embodiment is different from the display panel 20 of FIG. 6 in that the configuration and the arrangement of the encapsulation structures are different.

In the display panel 30 in the present embodiment, any two adjacent display units U are not arranged to be connected to each other. For example, a gap S1 between the encapsulation structure ES-A (that is, the first encapsulation structure) covering the first light emitting component LED1-A and the encapsulation structure ES-A (that is, the second encapsulation structure) covering the second light emitting component LED2-A along the direction X may be greater than 0 μm and less than or equal to 10 μm, and may preferably be less than or equal to 5 μm. Preferably, a gap S2 between the pixel opening PO of the first light emitting component LED1-A and the pixel opening PO of the second light emitting component LED2-A along the direction X is less than 16 μm.

It should be particularly noted that, similar to FIG. 2D and FIG. 2E in the previous embodiment, in the process of etching the first encapsulation material layer, the protection material layer, the second electrode layer and the light emitting material layer utilizing the second encapsulation pattern EP2-A as the hard mask, the present embodiment may allow the film layer below the second encapsulation pattern EP2-A to have an undercut by adjusting the etching velocity. Thus, in the present embodiment, the second encapsulation pattern EP2-A of the encapsulation structure ES-A protrudes outward relative to the respective edges of the first encapsulation pattern EP1-A, the light emitting pattern LEP, the second electrode E2 and the protection layer 130.

To further enhance the encapsulation effect, the encapsulation structures ES-A in the present embodiment may further optionally include a third encapsulation pattern EP3-A disposed on the second encapsulation pattern EP2-A. More specifically, the third encapsulation pattern EP3-A covers the edge EP2*e* of the second encapsulation pattern EP2-A, the edge EP1*e* of the first encapsulation pattern EP1-A, the edge 130*e* of the protection layer 130, the edge E2*e* of the second electrode E2 and the edge LEP*e* of the light emitting pattern LEP. The third encapsulation pattern EP3-A may be a multi-layered film structure of an inorganic material (including, for example, silicon nitride) and an organic material (including, for example, acrylic, epoxy, hexamethyldisiloxane (HMDSO), or other suitable organic materials). For example, the third encapsulation pattern EP3-A may be a three-layered film structure of an inorganic material, an organic material and an inorganic material, without being limited thereto.

Figures 10, 11:
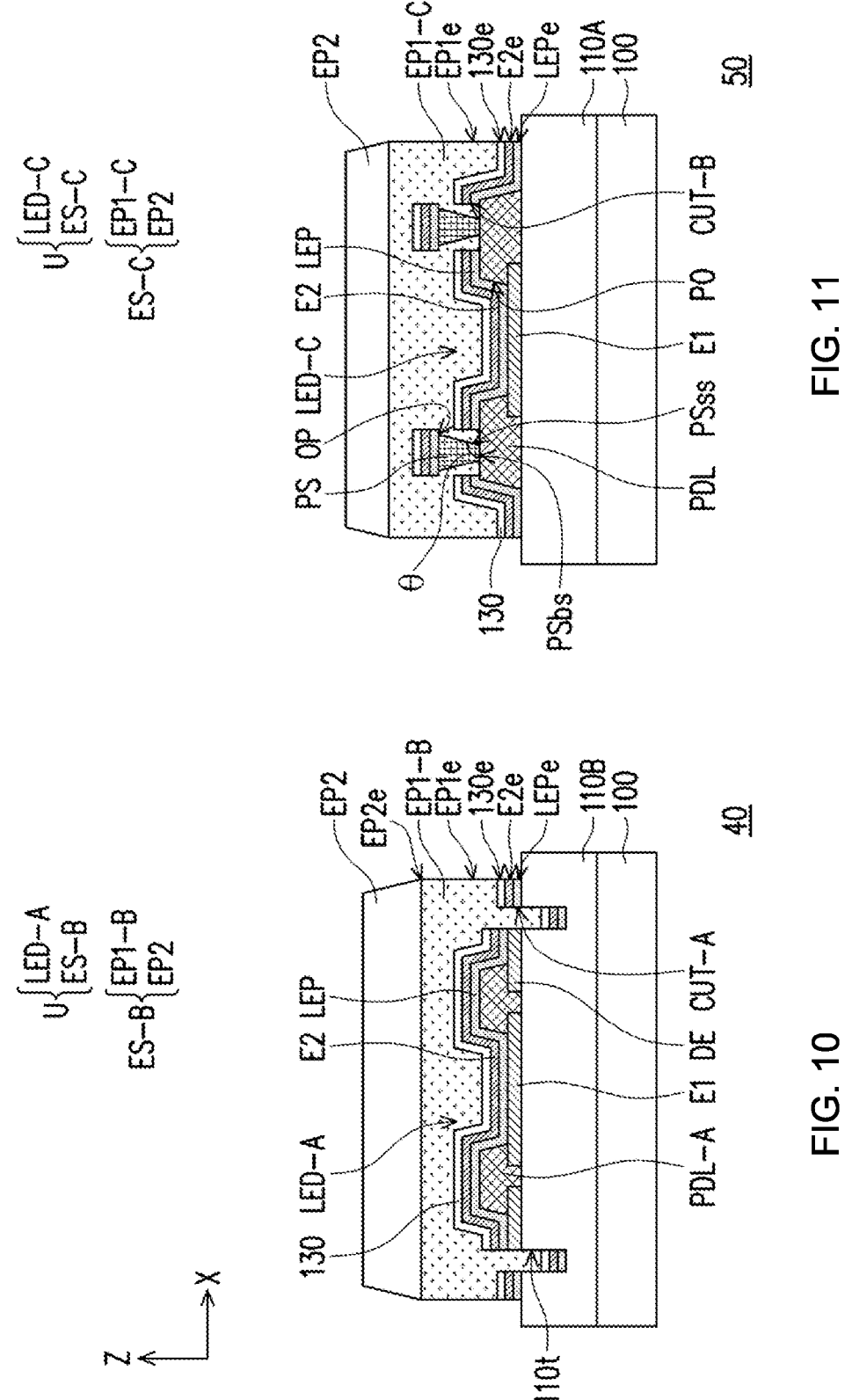
FIG. 10 is a sectional schematic view of a display panel according to a sixth embodiment of the present disclosure.
FIG. 11 is a sectional schematic view of a display panel according to a seventh embodiment of the present disclosure.

FIG. 10 is a sectional schematic view of a display panel according to a sixth embodiment of the present disclosure. For clarity, FIG. 10 illustrates only one of the display units U of the display panel 40. Referring to FIG. 10, different from the display panel 20 of FIG. 6, in which the breaking location CUT of the light emitting pattern LEP and the second electrode E2 is formed by the recess PDLn of the pixel definition layer PDL-A, in the present embodiment, the display panel 40 utilizes the recess 110*t* of the driving circuit layer 110B to form the breaking location CUT-A of the light emitting pattern LEP, the second electrode E2 and the protection layer 130.

In detail, the driving circuit layer 110B may be provided with a recess 110*t* outside the pixel opening PO of the pixel definition layer PDL-A. The recess 110*t* does not overlap with the pixel definition layer PDL-A, and is disposed in, for example, the flat layer (not illustrated) of the driving circuit layer 110B. It should be particularly noted that the dummy electrode DE partially overlapping with the pixel definition layer PDL-A extends toward a direction away from the pixel definition layer PDL-A to the recess 110*t* of the driving circuit layer 110B.

By providing the recess 110*t* of the driving circuit layer 110B, the light emitting pattern LEP, the second electrode E2 and the protection layer 130 may have the breaking location CUT-A overlapping with the recess 110*t*. Thus, the first encapsulation pattern EP1-B of the encapsulation structure ES-B being subsequently formed may be filled into the recess 110*t* of the driving circuit layer 110B through the breaking location CUT-A of the light emitting pattern LEP, the second electrode E2 and the protection layer 130 to completely cover the portion of the light emitting pattern LEP being electrically connected to the first electrode E1, thus preventing the previously formed light emitting components LED-A from encapsulation failure in the process of subsequently forming other light emitting components LED-A that lead to the oxidation of the light emitting patterns LEP thereof and the difficulties in illumination, and significantly enhancing the production yield of the display panel 40.

FIG. 11 is a sectional schematic view of a display panel according to a seventh embodiment of the present disclosure. For clarity, FIG. 11 illustrates only one of the display units U of the display panel 50. Referring to FIG. 11, different from the display panel 20 of FIG. 6, in which the breaking location CUT of the light emitting pattern LEP and the second electrode E2 is formed by the recess PDLn of the pixel definition layer PDL-A, in the present embodiment, the display panel 50 utilizes the gap layer PS of the light emitting component LED-C to form the breaking location CUT-B of the light emitting pattern LEP, the second electrode E2 and the protection layer 130.

In detail, the gap layer PS is disposed on the pixel definition layer PDL, and has an opening OP overlapping with the pixel opening PO of the pixel definition layer PDL, a bottom surface PSbs connected to the pixel definition layer PDL and a side surface PSss connected to the bottom surface PSbs. It should be particularly noted that an included angle θ between the side surface PSss and the bottom surface PSbs of the gap layer PS is greater than or equal to 90 degrees. For example, in the present embodiment, the contour of the cross-section of the gap layer PS is substantially an inverted trapezoid, without being limited thereto.

By providing the gap layer PS, the light emitting pattern LEP, the second electrode E2 and the protection layer 130 may have the breaking location CUT-B corresponding to the side surface PSss of the gap layer PS. Thus, the first encapsulation pattern EP1-C of the encapsulation structure ES-C being subsequently formed may be filled into the side surface PSss of the gap layer PS through the breaking location CUT-B of the light emitting pattern LEP, the second electrode E2 and the protection layer 130 to completely cover the portion of the light emitting pattern LEP being electrically connected to the first electrode E1, thus preventing the previously formed light emitting components LED-C from encapsulation failure in the process of subsequently forming other light emitting components LED-C that lead to the oxidation of the light emitting patterns LEP thereof and the difficulties in illumination, and significantly enhancing the production yield of the display panel 50.

Figure 12:
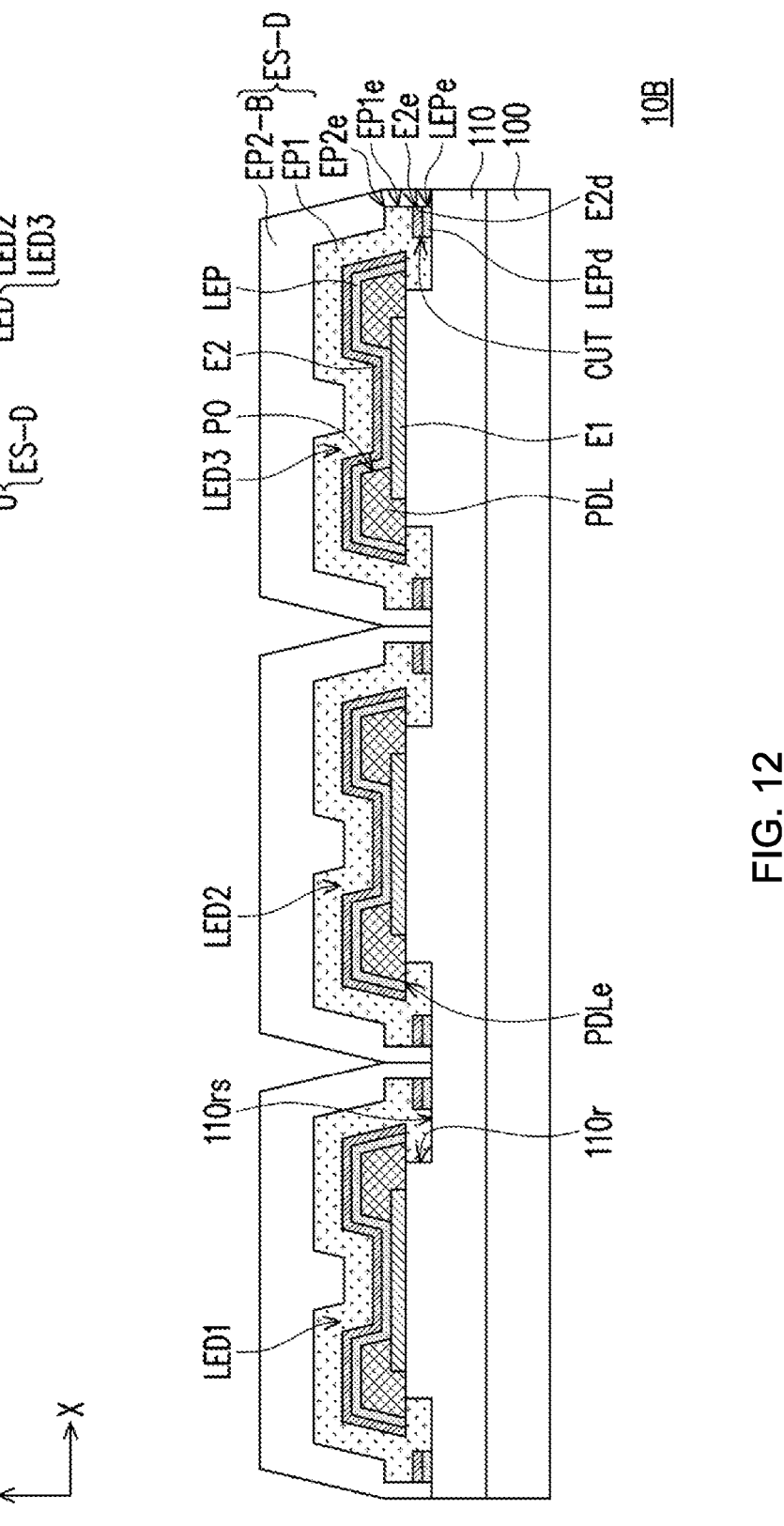
FIG. 12 is a sectional schematic view of a display panel according to an eighth embodiment of the present disclosure.

FIG. 12 is a sectional schematic view of a display panel according to an eighth embodiment of the present disclosure. For clarity, FIG. 12 illustrates only three of the display units U of the display panel 10B. Referring to FIG. 12, different from the display panel 10 of FIG. 1, in the display panel 10B in the present embodiment, the edge EP2e of the second encapsulation pattern EP2-B of the encapsulation structure ES-D is not aligned to the edge EP1e of the first encapsulation pattern EP1, the edge LEPe of the light emitting pattern LEP and the edge E2e of the second electrode E2.

More specifically, in the present embodiment, the second encapsulation pattern EP2-B covers the edge EP1e of the first encapsulation pattern EP1, the edge LEPe of the light emitting pattern LEP and the edge E2e of the second electrode E2, thus further enhancing the water and oxygen resistance of the encapsulation structures ES-D, and further enhancing the overall encapsulation effect of the display panel 10B.

Figure 13:
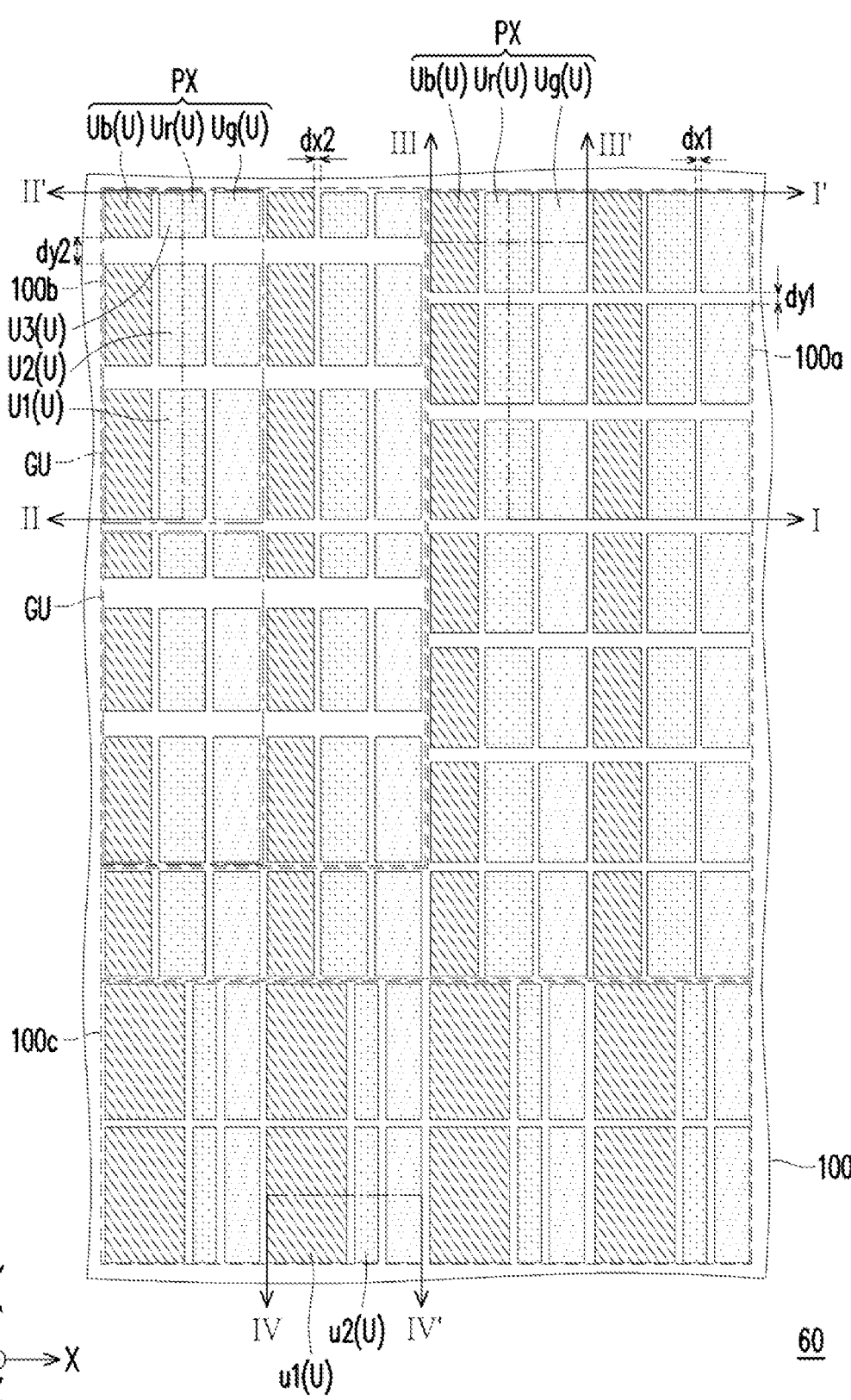
FIG. 13 is a top schematic view of a display panel according to a ninth embodiment of the present disclosure.
Figure 14:
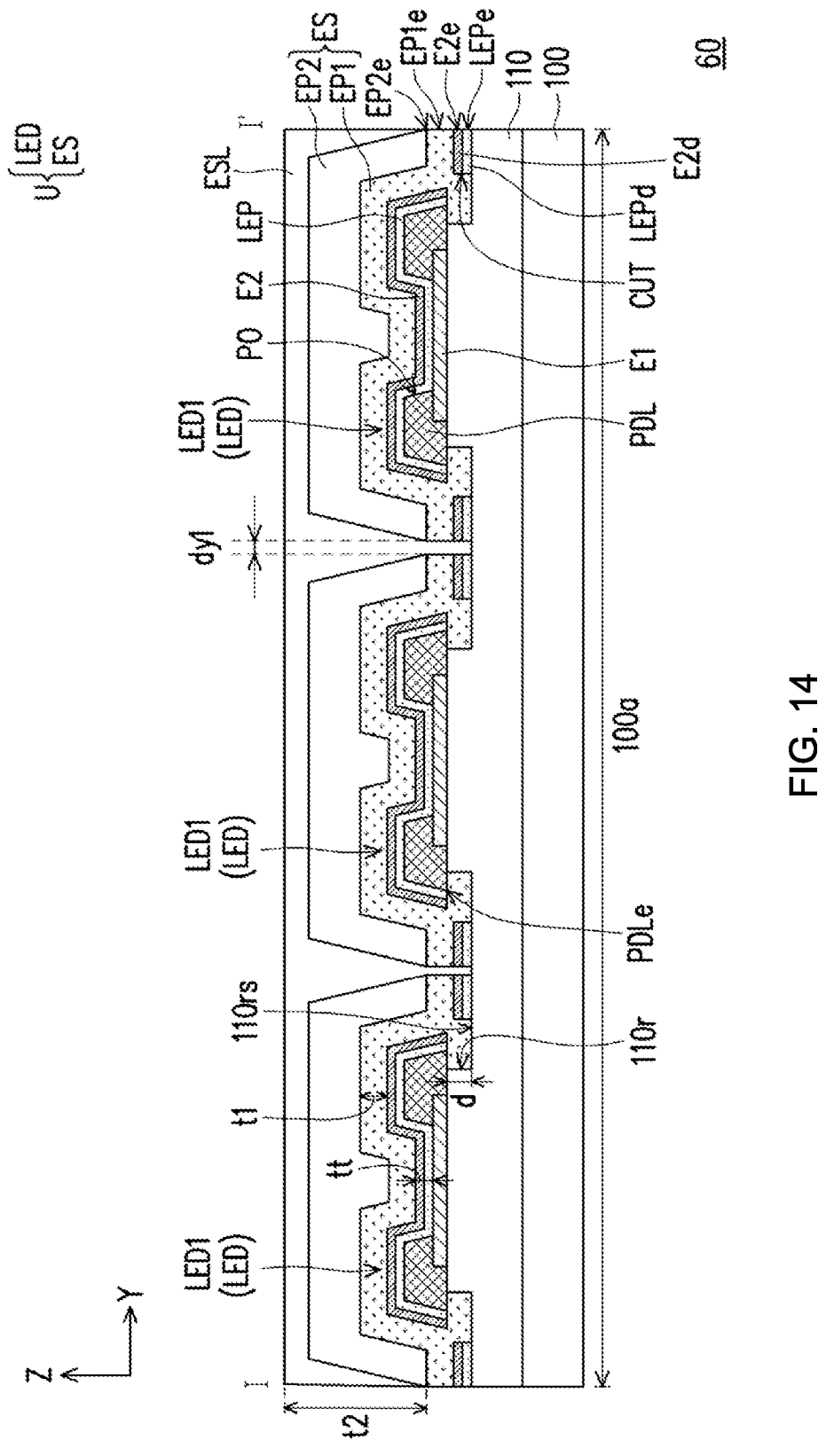
FIG. 14 is a sectional schematic view of a display panel according to the ninth embodiment of the present disclosure.
Figure 15:
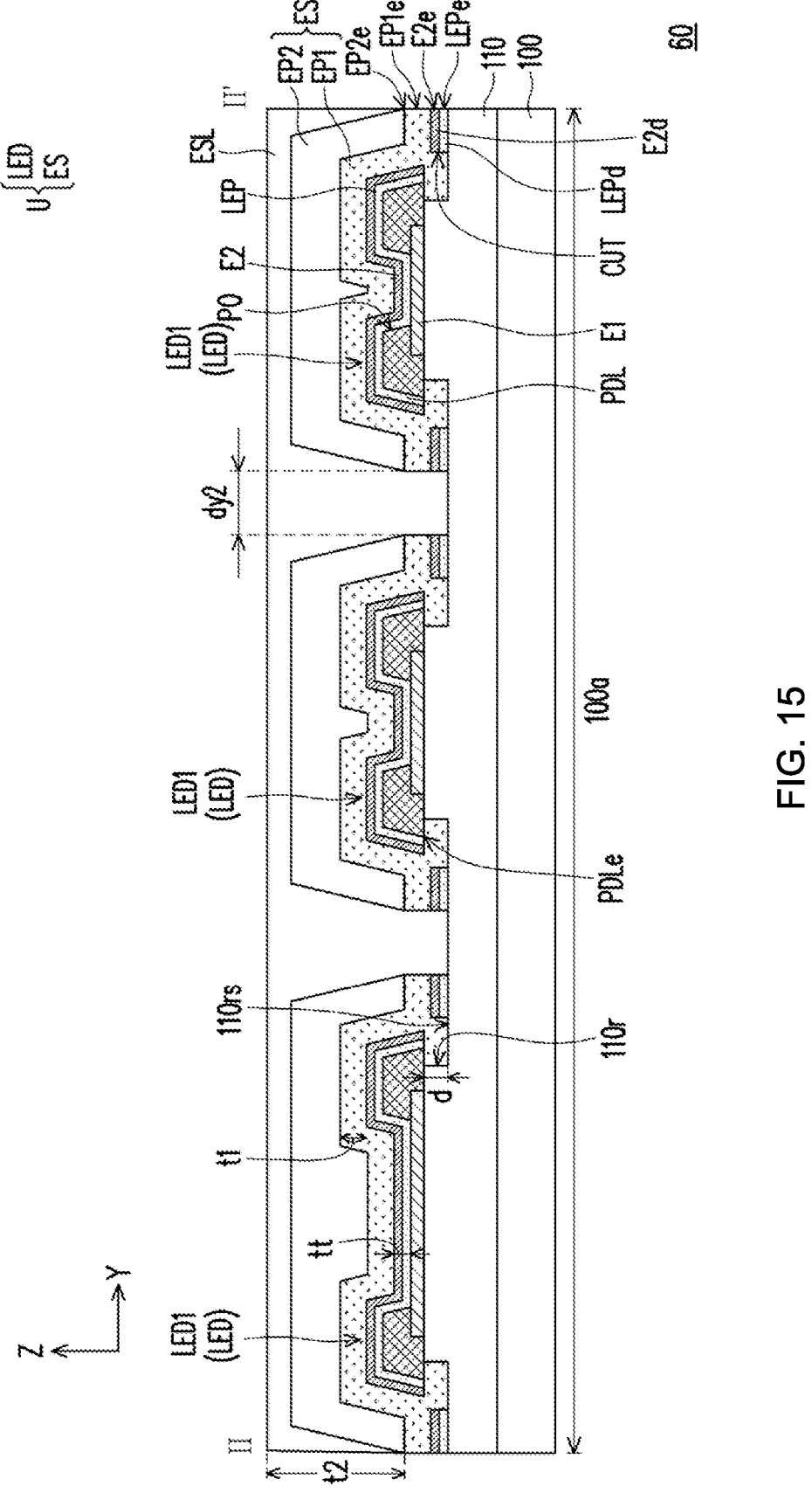
FIG. 15 is a sectional schematic view of a display panel according to the ninth embodiment of the present disclosure.
Figure 16:
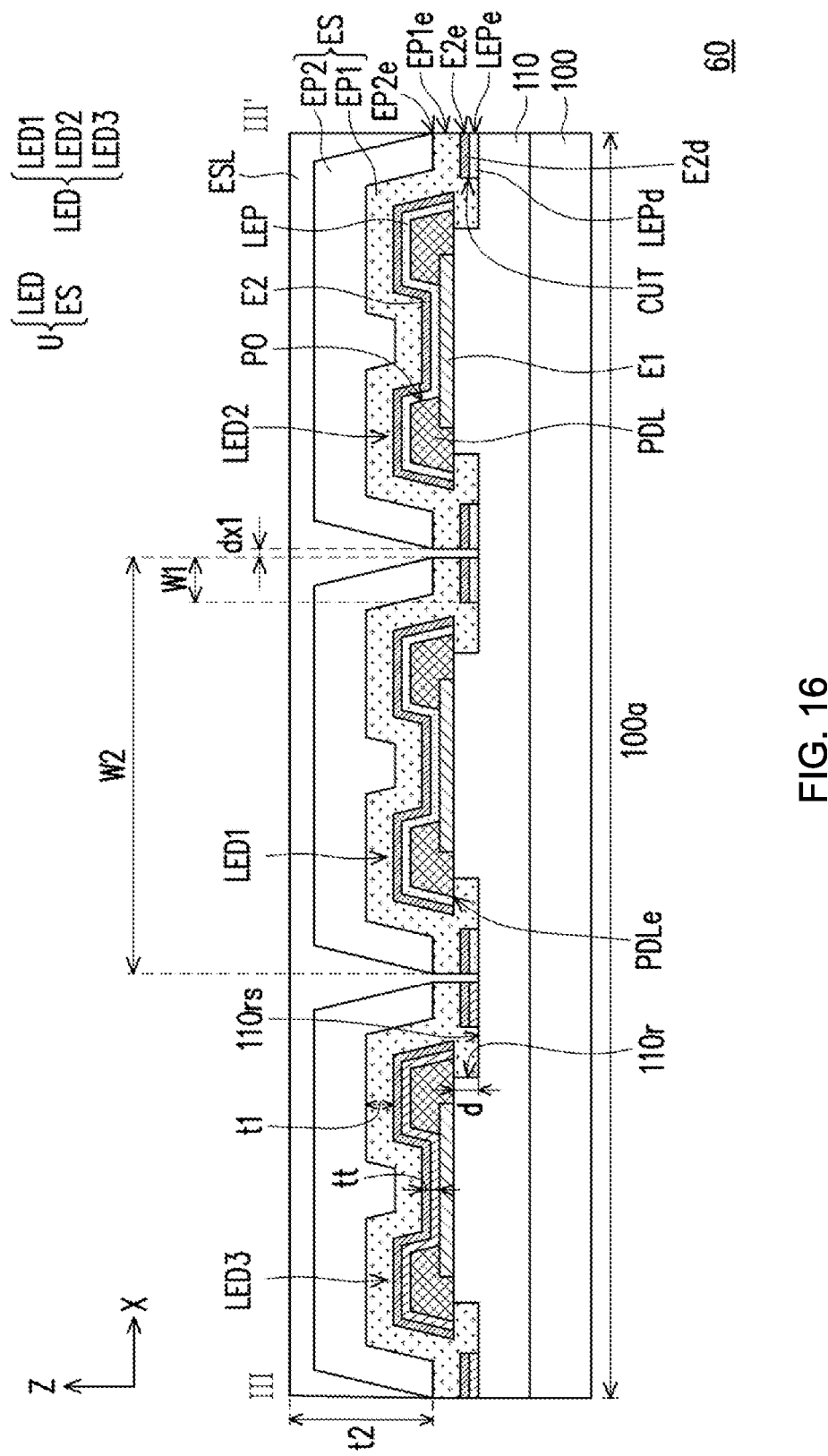
FIG. 16 is a sectional schematic view of a display panel according to the ninth embodiment of the present disclosure.
Figure 17:
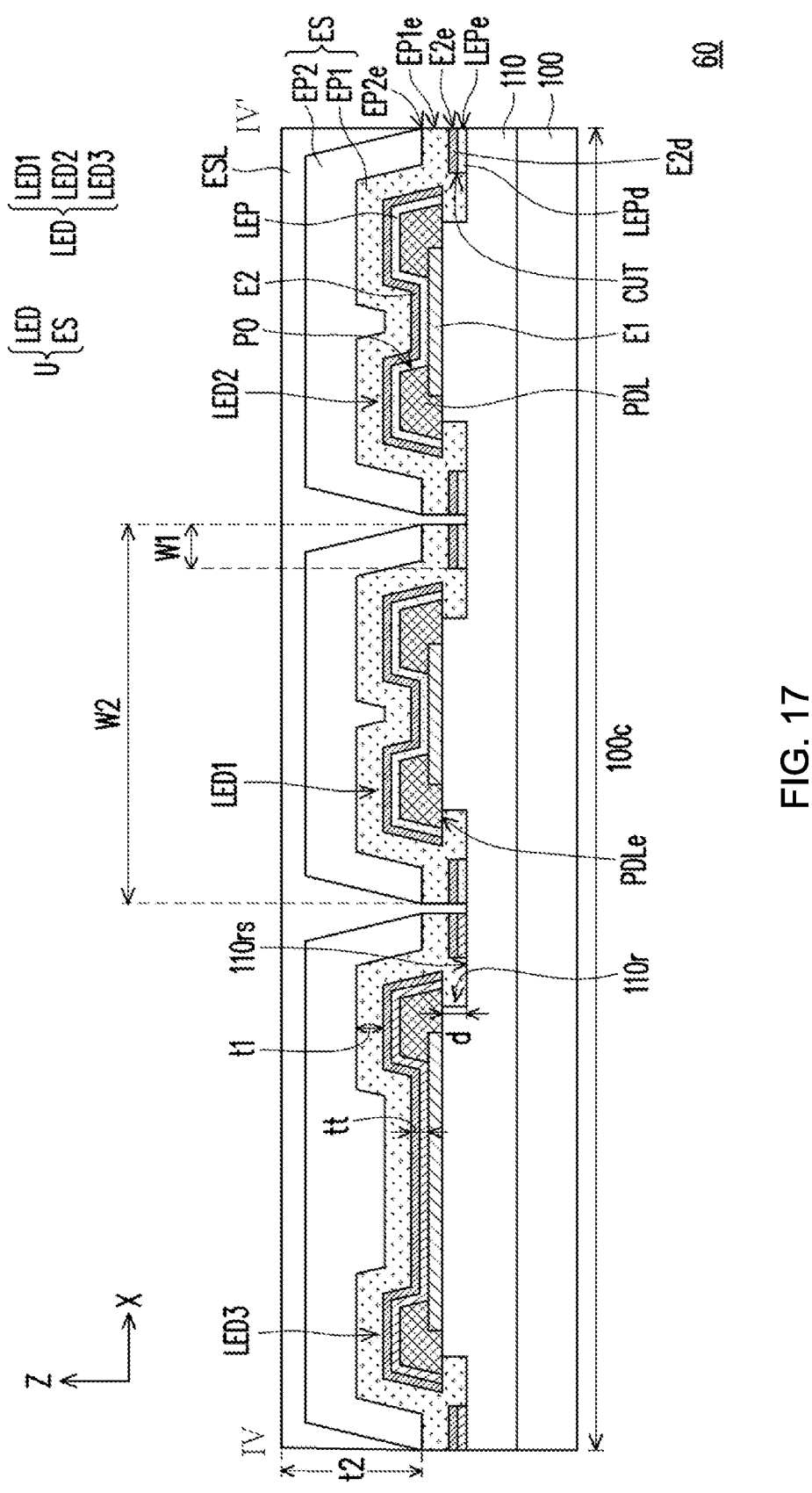
FIG. 17 is a sectional schematic view of a display panel according to the ninth embodiment of the present disclosure.

FIG. 13 is a top schematic view of a display panel according to a ninth embodiment of the present disclosure. FIG. 14 is a sectional schematic view of a display panel according to the ninth embodiment of the present disclosure. FIG. 15 is a sectional schematic view of a display panel according to the ninth embodiment of the present disclosure. FIG. 16 is a sectional schematic view of a display panel according to the ninth embodiment of the present disclosure. FIG. 17 is a sectional schematic view of a display panel according to the ninth embodiment of the present disclosure. FIG. 14, FIG. 15, FIG. 16 and FIG. 17 respectively correspond to the sectional lines I-I', II-II', III-III' and IV-IV'. FIG. 13 shows the substrate 100 and a plurality of display units U of the display panel 60, and omits other members of the display panel 60. For clarity, FIG. 13 to FIG. 17 illustrate the three intersecting directions X, Y, Z.

Referring to FIG. 13, FIG. 14 and FIG. 15, different from the previous embodiments, the substrate 100 of the display panel 60 has a normal display region 100a and a penetrating display region 100b outside the normal display region 100a. In one embodiment, the normal display region 100a may refer to a region used to display images that need to be frequently changed, and the penetrating display region 100b may refer to a region with high light transmittance, in which the transmittance of the penetrating display region 100b is higher than that of the normal display region 100a, and the penetrating display region 100b may be referred to as a transparent display region. In one embodiment, a photosensitive component (such as an under-screen camera component, an ambient light sensing component, etc., not illustrated) may be optionally provided behind the penetrating display region 100b, but the present disclosure is not limited thereto. In one embodiment, the display panel 60 further has a persistent screen display region 100c outside the normal display region 100a and the penetrating display region 100b. The persistent screen display region 100c may refer to a region used to display images that do not need to be frequently changed, such as the region below the computer desktop showing the toolbar, without being limited thereto.

Referring to FIG. 13 and FIG. 15, to facilitate the high transmittance of the penetrating display region 100b, there is no light emitting pattern LEP disposed between two adjacent display units U of the penetrating display region 100b. In other words, a gap dy2 exists between the light emitting patterns LEP of the two adjacent display units U disposed in the penetrating display region 100b. Referring to FIG. 13 and FIG. 16, in one embodiment, the display units U include a plurality of display units Ur, a plurality of display units Ug and a plurality of display units Ub. Each display unit Ur includes the first light emitting component LED1 used to emit light of a first color (such as the red light), each display unit Ug includes the second light emitting component LED2 used to emit light of a second color (such as the green light), and each display unit Ub includes the third light emitting component LED3 used to emit light of a third color (such as the blue light). One display unit Ur, one display unit Ug and one display unit Ub adjacent to each other form a pixel PX, and the display unit Ur, the display unit Ug and the display unit Ub of the pixel PX are arranged in the direction X. Referring to FIG. 13 and FIG. 15, in one embodiment, a gap dy2 may exist between the light emitting patterns LEP of the two adjacent display units U disposed in the penetrating display region 100b in the direction Y intersecting with the direction X. Referring to FIG. 13, in one embodiment, a gap dx2 may optionally exist between the light emitting patterns LEP of the two adjacent display units U disposed in the penetrating display region 100b in the direction X, but the present disclosure is not limited thereto.

Referring to FIG. 13, FIG. 14 and FIG. 15, in one embodiment, the gap dy2 between the light emitting patterns LEP of the two adjacent display units U disposed in the penetrating display region 100b is greater than the gap dy1 between the light emitting patterns LEP of the two adjacent display units U disposed in the normal display region 100a. For example, in one embodiment, the display unit Ur, the display unit Ug and the display unit Ub of a pixel PX are arranged in the direction X, and the gap dy2 between the light emitting patterns LEP of the two adjacent display units U disposed in the penetrating display region 100b in the direction Y intersecting with the direction X may be greater than the gap dy1 between the light emitting patterns LEP of the two adjacent display units U disposed in the normal display region 100a in the direction Y. In one embodiment, the gap dx2 between the light emitting patterns LEP of the two adjacent display units U disposed in the penetrating display region 100b in the direction X may also be greater than the gap dx1 between the light emitting patterns LEP of the two adjacent display units U disposed in the normal display region 100a in the direction X. In a further embodiment not illustrated, the gaps dx2, dy2 between the light emitting patterns LEP of the two adjacent display units U disposed in the penetrating display region 100b in the direction X and the direction Y may be respectively greater than the gaps dx1, dy1 between the light emitting patterns LEP of the two adjacent display units U disposed in the normal display region 100a in the direction X and the direction Y.

Referring to FIG. 13 and FIG. 15, in one embodiment, the display units U disposed in the penetrating display region 100b include a plurality of first display units U1, a plurality of second display units U2 and a plurality of third display units U3. An area of the pixel opening PO of each first display unit U1 is greater than an area of the pixel opening PO of each second display unit U2, and the area of the pixel opening PO of each second display unit U2 is greater than an area of the pixel opening PO of each third display unit U3. The display units U are divided into a plurality of display unit groups GU, and each display unit group GU includes a first display unit U1, a second display unit U2 and a third display unit U3 arranged sequentially in the direction Y. The first display unit U1, the second display unit U2 and the third display unit U3 of the same display unit group GU are used to display a same color, and the display unit groups GU are arranged in the direction Y. In other words, in the penetrating display region 100*b*, the light emitting areas of the display units U adjacent to each other and used to display the same color may be different. Thus, on the premise of the penetrating display region 100*b* having the higher transmittance, the resolution (that is, the quantity of the pixels in a unit area thereof) of the penetrating display region 100*b* and the resolution of the normal display region 100*a* are identical, thereby enhancing the visual effect of the display panel 60, and preventing a user from noticing a sudden drop of the image quality when scanning from the normal display region 100*a* to the penetrating display region 100*b*. In addition, in one embodiment, the display units U disposed in the penetrating display region 100*b* that are adjacent to each other and used to display the same color have light emitting areas with different sizes, thus being capable of displaying extremely low grayscale images by writing gamma values in partitions.

Referring to FIG. 13 and FIG. 15, in one embodiment, the first display unit U1, the second display unit U2 and the third display unit U3 of each display unit group GU are used to display the same color, and the current being provided to the first electrode E1 of the first display unit U1, the current being provided to the first electrode E1 of the second display unit U2 and the current being provided to the first electrode E1 of the third display unit U3 may be different from each other. Different current values are provided according to the sizes of the pixel openings PO of the first display unit U1, the second display unit U2 and the third display unit U3, thus achieving the brightness uniformity between the first display unit U1, the second display unit U2 and the third display unit U3, and achieving display consistency in the visual effect thereof. In one embodiment, the different current values may be controlled and provided to the first display unit U1, the second display unit U2 and the third display unit U3 by a driving chip. However, the present disclosure is not limited thereto. In other embodiments, it is possible to provide different current values to the first display unit U1, the second display unit U2 and the third display unit U3 by other methods. For example, in another embodiment, a width-to-length ratio of the channels of the thin film transistors electrically connected to the first display unit U1, the second display unit U2 and the third display unit U3 respectively may be designed to have different values in order to provide different current values to the first display unit U1, the second display unit U2 and the third display unit U3.

Referring to FIG. 13 and FIG. 17, in one embodiment, the display units U include a plurality of first color display units u1 used to display a first color and a plurality of second color display units u2 used to display a second color, and an area of the pixel opening PO of one first color display unit u1 and an area of the pixel opening PO of one second color display unit u2 disposed in the persistent screen display region 100*c* and adjacent to each other are different. For example, in one embodiment, the persistent screen display region 100*c* is most consistently used to show an image of a certain color (such as the blue color), the first color display unit u1 is used to display the certain color (such as the blue color), the second color display unit u2 is used to display other colors (such as the red color or the green color), and the area of the pixel opening PO of the first color display unit u1 is greater than the area of the pixel opening PO of the second color display unit u2, thus prolonging the overall usage life of the persistent screen display region 100*c*.

In sum, in the display panel according to one embodiment of the present disclosure, the light emitting pattern and the second electrode of each light emitting component extend from the corresponding pixel opening of the pixel definition layer out of the pixel opening, and cover the pixel definition layer. Each encapsulation structure serve as a hard mask for defining the light emitting pattern and the second electrode, which may increase the alignment accuracy of the manufacturing process, and prevent the previously formed light emitting patterns from oxidation in the process that lead to difficulties in illumination.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:
   a driving circuit layer;
   a plurality of light emitting components, disposed on the driving circuit layer, and each comprising:
   a first electrode;
   a light emitting pattern, disposed on the first electrode;
   a second electrode, disposed on the light emitting pattern; and
   a pixel definition layer, disposed on the driving circuit layer, and having a pixel opening overlapping with the first electrode, wherein the light emitting pattern and the second electrode cover the pixel definition layer, the first electrode located in the pixel opening of the pixel definition layer and a portion of the driving circuit layer located outside the pixel opening of the pixel definition layer, and the light emitting pattern is electrically connected to the first electrode through the pixel opening; and
   a plurality of encapsulation structures, respectively covering the light emitting components, wherein each of the encapsulation structures comprises a first encapsulation pattern, and edges of the first encapsulation pattern, the light emitting pattern and the second electrode overlapping with each other are aligned with each other;
   wherein the light emitting components and the encapsulation structures form a plurality of display units, and each of the display units comprises one of the light emitting components and one of the encapsulation structures overlapping with each other;

wherein the display panel has a penetrating display region, and a gap exists between a plurality of light emitting patterns of two adjacent ones of the display units disposed in the penetrating display region;

wherein the display panel further has a normal display region outside the penetrating display region, and the gap between the light emitting patterns of the two adjacent ones of the display units disposed in the penetrating display region is greater than a gap between a plurality of light emitting patterns of two adjacent ones of the display units disposed in the normal display region.

2. The display panel according to claim 1, wherein the display units disposed in the penetrating display region include a plurality of first display units and a plurality of second display units, an area of the pixel opening of each of the first display units is greater than an area of the pixel opening of each of the second display units, the display units are divided into a plurality of display unit groups, each of the display unit groups includes a corresponding first display unit of the first display units and a corresponding second display unit of the second display units arranged sequentially in a direction, and the display unit groups are arranged in the direction.

3. The display panel according to claim 2, wherein the corresponding first display unit and the corresponding second display unit of each of the display unit groups are configured to display a same color, and a current provided to the first electrode of the corresponding first display unit and a current provided to the first electrode of the corresponding second display unit are different from each other.

4. The display panel according to claim 2, wherein the display units disposed in the penetrating display region further include a plurality of third display units, an area of the pixel opening of each of the second display units is greater than an area of the pixel opening of each of the third display units, and each of the display unit groups includes the corresponding first display unit, the corresponding second display unit and a corresponding third display unit of the third display units arranged sequentially in the direction.

5. The display panel according to claim 4, wherein the corresponding first display unit, the corresponding second display unit and the corresponding third display unit of each of the display unit groups are configured to display a same color, and a current provided to the first electrode of the corresponding first display unit, a current provided to the first electrode of the corresponding second display unit and a current provided to the first electrode of the corresponding third display unit are different from each other.

6. The display panel according to claim 1, wherein the display panel further has a persistent screen display region outside the penetrating display region, the display units include a plurality of first color display units configured to display a first color and a plurality of second color display units configured to display a second color, and areas of the pixel openings of one of the first color display units and one of the second color display units disposed in the persistent screen display region and adjacent to each other are different.

7. A display panel, comprising:

a driving circuit layer;

a plurality of light emitting components, disposed on the driving circuit layer, and each comprising:

a first electrode;

a light emitting pattern, disposed on the first electrode;

a second electrode, disposed on the light emitting pattern; and a pixel definition layer, disposed on the driving circuit layer, and having a pixel opening overlapping with the first electrode, wherein the light emitting pattern and the second electrode cover the pixel definition layer, the first electrode located in the pixel opening of the pixel definition layer and a portion of the driving circuit layer located outside the pixel opening of the pixel definition layer, and the light emitting pattern is electrically connected to the first electrode through the pixel opening; and a plurality of encapsulation structures, respectively covering the light emitting components, wherein each of the encapsulation structures comprises a first encapsulation pattern, and edges of the first encapsulation pattern, the light emitting pattern and the second electrode overlapping with each other are aligned with each other;

wherein the light emitting components and the encapsulation structures form a plurality of display units, and each of the display units comprises one of the light emitting components and one of the encapsulation structures overlapping with each other;

wherein the display panel has a penetrating display region, and a gap exists between a plurality of light emitting patterns of two adjacent ones of the display units disposed in the penetrating display region;

wherein the display units disposed in the penetrating display region include a plurality of first display units and a plurality of second display units, an area of the pixel opening of each of the first display units is greater than an area of the pixel opening of each of the second display units, the display units are divided into a plurality of display unit groups, each of the display unit groups includes a corresponding first display unit of the first display units and a corresponding second display unit of the second display units arranged sequentially in a direction, and the display unit groups are arranged in the direction.

8. The display panel according to claim 7, wherein the corresponding first display unit and the corresponding second display unit of each of the display unit groups are configured to display a same color, and a current provided to the first electrode of the corresponding first display unit and a current provided to the first electrode of the corresponding second display unit are different from each other.

9. The display panel according to claim 7, wherein the display units disposed in the penetrating display region further include a plurality of third display units, an area of the pixel opening of each of the second display units is greater than an area of the pixel opening of each of the third display units, and each of the display unit groups includes the corresponding first display unit, the corresponding second display unit and a corresponding third display unit of the third display units arranged sequentially in the direction.

10. The display panel according to claim 9, wherein the corresponding first display unit, the corresponding second display unit and the corresponding third display unit of each of the display unit groups are configured to display a same color, and a current provided to the first electrode of the corresponding first display unit, a current provided to the first electrode of the corresponding second display unit and a current provided to the first electrode of the corresponding third display unit are different from each other.

11. The display panel according to claim 7, wherein the display panel further has a persistent screen display region outside the penetrating display region, the display units include a plurality of first color display units configured to display a first color and a plurality of second color display units configured to display a second color, and areas of the pixel openings of one of the first color display units and one of the second color display units disposed in the persistent screen display region and adjacent to each other are different.

\* \* \* \* \*